(12) United States Patent
Fukuyoshi et al.

(10) Patent No.: US 8,049,805 B2
(45) Date of Patent: Nov. 1, 2011

(54) COLOR IMAGING DEVICE AND COLOR IMAGING DEVICE MANUFACTURING METHOD

(75) Inventors: Kenzo Fukuyoshi, Tokyo (JP); Satoshi Kitamura, Tokyo (JP); Tadashi Ishimatsu, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 556 days.

(21) Appl. No.: 12/285,367

(22) Filed: Oct. 2, 2008

(65) Prior Publication Data

US 2009/0040345 A1 Feb. 12, 2009

Related U.S. Application Data

(63) Continuation of application No. PCT/JP2007/057483, filed on Apr. 3, 2007.

(30) Foreign Application Priority Data

Apr. 3, 2006 (JP) .................................. 2006-102121
Apr. 19, 2006 (JP) .................................. 2006-115901

(51) Int. Cl.
*H04N 9/07* (2006.01)
*H04N 5/225* (2006.01)
*H01L 21/00* (2006.01)
*H01L 31/0232* (2006.01)
*H01J 40/14* (2006.01)

(52) U.S. Cl. .......... 348/336; 348/340; 438/70; 257/432; 250/226

(58) Field of Classification Search .................. 348/336, 348/340; 438/70; 257/432; 250/226
See application file for complete search history.

(56) References Cited

U.S. PATENT DOCUMENTS

| 6,359,323 | B1 * | 3/2002 | Eom et al. ...................... 257/440 |
| 7,180,044 | B2 * | 2/2007 | Yu .............................. 250/208.1 |
| 7,493,713 | B2 * | 2/2009 | Park ................................... 38/70 |
| 2003/0215967 | A1 | 11/2003 | Shizukuishi | |
| 2004/0070039 | A1 | 4/2004 | Sekine et al. | |
| 2004/0185588 | A1 * | 9/2004 | Fukuyoshi et al. ............. 438/22 |
| 2005/0098842 | A1 * | 5/2005 | Yamamoto .................... 257/428 |

(Continued)

FOREIGN PATENT DOCUMENTS

JP      59-122193      7/1984

(Continued)

OTHER PUBLICATIONS

European Search Report dated Apr. 15, 2011 in corresponding European Patent Application 07740919.1.

(Continued)

*Primary Examiner* — Lin Ye
*Assistant Examiner* — Mekonnen Dagnew

(57) ABSTRACT

A color imaging device includes a semiconductor substrate including a plurality of photoelectric transducers, and a color filter including a plurality of coloring layers provided to associate with the photoelectric transducers of the semiconductor substrate. Each of the coloring layers of the color filter including a side surface that is erected with respect to a surface of the semiconductor substrate, and an inclined surface that is continuous from an end of the side surface located in the opposite side of the semiconductor substrate toward an end portion of the coloring layer located in the opposite side of the semiconductor substrate. The coloring layers are arranged with their side surfaces being in contact with each other without a gap therebetween, and the end portion of the coloring layer has a curved surface shape protruding toward the opposite side of the corresponding photoelectric transducer.

14 Claims, 8 Drawing Sheets

U.S. PATENT DOCUMENTS

| | | |
|---|---|---|
| 2006/0023314 A1 | 2/2006 | Boettiger et al. |
| 2008/0265349 A1* | 10/2008 | Kasano et al. ................ 257/432 |
| 2010/0261303 A1* | 10/2010 | Ogata et al. .................... 438/70 |

FOREIGN PATENT DOCUMENTS

| | | |
|---|---|---|
| JP | 59-198754 | 11/1984 |
| JP | 60-38989 | 2/1985 |
| JP | 60-53073 | 3/1985 |
| JP | 7-333419 | 12/1995 |
| JP | 11-23830 | 1/1999 |
| JP | 11-340446 | 12/1999 |
| JP | 2004-140426 | 5/2004 |
| JP | 2005-217439 | 8/2005 |
| JP | 2005-223084 | 8/2005 |
| JP | 2005-294467 | 10/2005 |
| WO | 2004/006336 | 1/2004 |
| WO | WO 2004/006336 | 1/2004 |
| WO | 2006/001317 A1 | 1/2006 |

OTHER PUBLICATIONS

Korean Office Action issued Feb. 28, 2011 in corresponding Korean Patent Application 10-2008-7024255.

Japanese Office Action issued Feb. 22, 2011 in corresponding Japanese Patent Application 2006-115901.

Korean Office Action issued Jul. 29, 2010 in corresponding Korean Patent Application 10-2008-7024255.

International Preliminary Report on Patentability mailed on Nov. 27, 2008 and issued in corresponding International Patent Application No. PCT/JP2007/057483.

* cited by examiner

COLOR IMAGING DEVICE AND COLOR IMAGING DEVICE MANUFACTURING METHOD

CROSS REFERENCE TO RELATED APPLICATIONS

This is a Continuation application of PCT Application No. PCT/JP2007/057483, filed Apr. 3, 2007, which was published under PCT Article 21(2) in Japanese.

This application is based upon and claims the benefit of priority from prior Japanese Patent Applications No. 2006-102121, filed Apr. 3, 2006; and No. 2006-115901, filed Apr. 19, 2006, the entire contents of both of which are incorporated herein by reference.

BACKGROUND OF THE INVENTION

1. Field of the Invention

The present invention relates to a color imaging device and a color imaging device manufacturing method.

2. Description of the Related Art

In a conventional color imaging device, color filters of a plurality of colors are formed to be adjacent to each other without gaps therebetween by using a photolithography technology on a plurality of photoelectric transducers provided on a semiconductor substrate. Each color filter has a thickness of approximately 1 µm. It should be noted that the color filters include a colorless filter.

In recent years, high pixelation of the imaging device advances, and the number of pixels of the imaging device has recently reached the millions. Further, with such advancement of high pixelation, a percentage of an area occupied by various wiring lines and electronic circuits required to operate each pixel is increased in each pixel. As a result, a percentage of an area that can be actually utilized for the photoelectric transducers to receive light (a numerical aperture) is currently approximately 20 to 40% in each pixel. This means that the luminous sensitivity of the imaging device is reduced.

JP-A 1984-122193 (KOKAI), JP-A 1985-38989 (KOKAI), JP-A 1985-53073 (KOKAI), and JP-A 2005-294467 (KOKAI) disclose that a microlens is arranged on each color filter to associate with each photoelectric transducer in order to improve the luminous sensitivity of an imaging device.

JP-A 1984-198754 (KOKAI) discloses that a hemispherical colored microlens is used as a color filter.

JP-A 2005-217439 (KOKAI) and JP-A 2005-223084 (KOKAI) disclose that arranging a photoelectric transducer at a position as close to a surface of a semiconductor substrate as possible in the semiconductor substrate configuring an imaging device enables increasing a light quantity that can be received by the photoelectric transducer, thereby improving the sensitivity of the imaging device.

FIG. 8 schematically shows a conventional example where microlenses are arranged on color filters to associate with photoelectric transducers in order to improve the luminous sensitivity of an imaging device. In this conventional example, in order to improve the luminous sensitivity of an imaging device 54 having a plurality of photoelectric transducers 52 provided in a semiconductor substrate 50, microlenses 64 are arranged on the surfaces of color filters 58 and 60 of a plurality of colors via a transparent flattening layer 62, the color filters 58 and 60 being provided on a surface of the semiconductor substrate 50 via an ultraviolet absorbing layer 56 to associate with the plurality of photoelectric transducers 52.

However, in this conventional example, color mixing tends to occur in light near side surfaces of the color filters 58 and 60 of the plurality of colors that are adjacently in contact with each other without gaps therebetween. That is, a part of a light beam 66 that has obliquely entered a part of the side surface of the color filter 58 close to the microlens 64 is transmitted through a corner portion including the part of the side surface of the color filter 58 and enters the adjacent color filter 60, thus resulting in color mixing in light near the side surface of the adjacent color filter 60.

In the photoelectric transducer 52 where color mixing has occurred (the photoelectric transducer associated with the color filter denoted by reference number 60 in FIG. 8), color reproducibility and luminosity are reduced, and color shading occurs in the entire imaging device 54.

Furthermore, such entering of a part of light from the adjacent color filter tends to occur when an incidence angle of light entering the photoelectric transducer becomes shallower.

FIG. 9 schematically shows a conventional imaging device 74 in which a plurality of photoelectric transducers 72 are provided to be adjacent to a surface of a semiconductor substrate 70 in the semiconductor substrate 70 in order to improve the luminous sensitivity. Here, color filters 76 and 78 of a plurality of colors are arranged on the surface of the semiconductor substrate 70 to associate with the plurality of photoelectric transducers 72.

In this case using no microlens, a part of a light beam 80 that has obliquely entered a part of one of side surfaces of the plurality of color filters 76 and 78 (e.g., a part of a side surface of the color filter 76 in FIG. 9), the side surfaces being adjacently in contact without gaps therebetween and the part of one of the side surfaces being close to a surface of the color filter, may enter an adjacent color filter (the color filter 78 in FIG. 9) from a side surface of the adjacent color filter like the above described case using the microlenses. In this case, color mixing occurs in the light near the side surface of the adjacent color filter, thus obtaining the same result as described above.

In this case, like the above described case, entering of a part of the light from the adjacent color filter tends to occur when an incidence angle of the light entering the photoelectric transducer becomes shallow.

In order to avoid such color mixing, JP-A 2005-294467 (KOKAI) discloses a technology by which an upper portion of a color filter and a transparent resin mounted on an upper surface of the color filter configure a microlens. That is, the transparent resin mounted on the upper surface of the color filter configures an upper portion of a curved surface of a convex microlens, and then an upper region of the color filter formed to be continuous with a curvature of the upper portion of the curved surface of the convex microlens configured by the transparent resin configures a lower portion of the microlens.

Further, such a microlens is formed by transferring a shape of a lens mother model formed on the surface of the transparent resin onto the transparent resin and the upper region of the color filter through dry etching using the lens mother model as a mask. However, when different color filters are dry-etched under the same etching conditions, the etching rate varies depending on the different color filters. As a result, when each of the upper regions of the different color filters that are adjacent to each other is formed by dry etching to have a curvature that is continuous with the curved surface of the convex microlens formed of the transparent resin, the curvature varies depending on each of the upper regions of the different color filters. Furthermore, a degree of surface roughness also varies depending on each of the upper regions of the different color filters formed to be continuous with the curved convex surface of the microlens by dry etching. Moreover, a balance of colors of light entering the plurality of photoelectric transducers associated with the color filters of the plurality of colors through the color filters of the plurality of colors is degraded, thereby producing color shading in the entire color imaging device.

In the conventional case using the hemispherical colored microlens as a color filter to improve the luminous sensitivity of the imaging device, there is a difference in a length of a light path of light transmitted through the microlens after entering the microlens between a central portion of the microlens and a peripheral portion thereof. When there is the difference in the length of the light path transmitted through the color filter, coloring of a light beam transmitted through each light path differs from each other. As a result, a great difference in spectral characteristics occurs in light beams transmitted through the central portion of the microlens and the peripheral portion thereof.

Since a light quantity transmitted through the central portion is larger than a light quantity transmitted through the peripheral portion in the microlens, light transmitted through the microlens colored to also serve as a color filter has a pale color as a whole. This means that the microlens colored to also serve as the color filter has a low color separation capability.

On the other hand, when coloring in the microlens colored to also serve as the color filter is heightened, the luminosity of light transmitted through such a microlens is lowered. Additionally, when an amount of a coloring agent contained in the microlens is increased, smoothness of the surface of the microlens is degraded, and a function as the microlens is lowered.

BRIEF SUMMARY OF THE INVENTION

According to one aspect of the invention, a color imaging device comprises a semiconductor substrate including a plurality of photoelectric transducers, and a color filter including a plurality of coloring layers provided to associate with the plurality of photoelectric transducers of the semiconductor substrate. Each of the plurality of coloring layers of the color filter includes a side surface that is erected with respect to a surface of the semiconductor substrate, and an inclined surface that is continuous from an end of the side surface located in the opposite side of the semiconductor substrate toward an end portion of the coloring layer located in the opposite side of the semiconductor substrate. The plurality of coloring layers are arranged with their side surfaces being in contact with each other without a gap therebetween. And, the end portion of the coloring layer has a curved surface shape protruding toward the opposite side of the corresponding photoelectric transducer.

According to another aspect of the invention, a color imaging device comprises a semiconductor substrate including a plurality of photoelectric transducers, and a color filter including a plurality of coloring layers provided to associate with the plurality of photoelectric transducers of the semiconductor substrate. Each of the plurality of coloring layers of the color filters includes a side surface that is erected with respect to a surface of the semiconductor substrate, and an inclined surface that is continuous from an end of the side surface located in the opposite side of the semiconductor substrate toward an end portion of the coloring layer located in the opposite side of the semiconductor substrate. The plurality of coloring layers are arranged with their side surfaces being in contact with each other without a gap therebetween. The end portion of the coloring layer includes a flat surface crossing the inclined surface. A microlens of a transparent resin is laminated on the flat surface of the end portion of the coloring layer. The microlenses laminated on the flat surfaces of the end portions of the two coloring layers adjacent to each other are connected with each other through the transparent resin filling a groove formed between the opposed inclined surfaces of the two coloring layers adjacent to each other.

According to further aspect of the invention, a color imaging device manufacturing method comprises forming a predetermined color resist layer on a semiconductor substrate including a plurality of photoelectric transducers, and forming a coloring layer to associate with the predetermined photoelectric transducer by exposing and developing the color resist layer, and forming the color resist layer and forming the coloring layer being repeated to form a color filter including the plurality of coloring layers that are associated with the plurality of photoelectric transducers of the semiconductor substrate and that are adjacent to each other. In the forming of the coloring layer, the coloring layer is formed to include a side surface that is erected with respect to a surface of the semiconductor substrate, and an inclined surface that is continuous from an end of the side surface located in the opposite side of the semiconductor substrate toward an end portion of the coloring layer located in the opposite side of the semiconductor substrate. And, the plurality of coloring layers are arranged with the side surfaces thereof being in contact with each other without a gap therebetween by repeating forming the color resist layer and forming the coloring layer more than once, thereby forming the color filter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Now, with reference to FIGS. 1A to 2B, it will be explained in detail how a color filter is formed in an imaging device by a color filter manufacturing method for a color imaging device according to a first embodiment of the present invention to manufacture a color imaging device according to a first embodiment of the present invention.

Figure 1A:
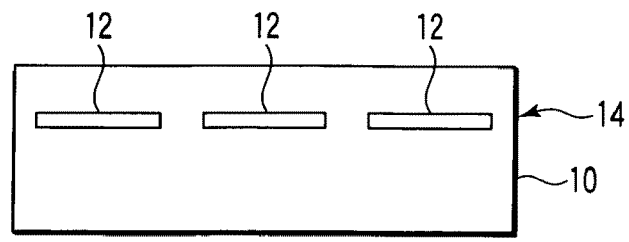
FIG. 1A is a schematic vertical sectional view of an imaging device comprising a semiconductor substrate including a plurality of photoelectric transducers before color filters are formed by a color imaging device manufacturing method according to a first embodiment of the present invention.

FIG. 1A shows a schematic vertical cross sectional view of an imaging device 14 in which a plurality of CMOS photoelectric transducers 12 are provided in a semiconductor substrate 10. Although the photoelectric transducers are the CMOS photoelectric transducers 12 in this embodiment, but the photoelectric transducers may be CCD photoelectric transducers in a concept of the present invention. A configuration of such an imaging device 14 is well known, and it will not be explained in further detail here.

A pixel size in a plan view to which the present invention can be applied is ranging from approximately 10 µm to approximately 1 µm, and it is in the range between approximately 2.5 µm and approximately 2.2 µm in this embodiment.

Figure 1B:
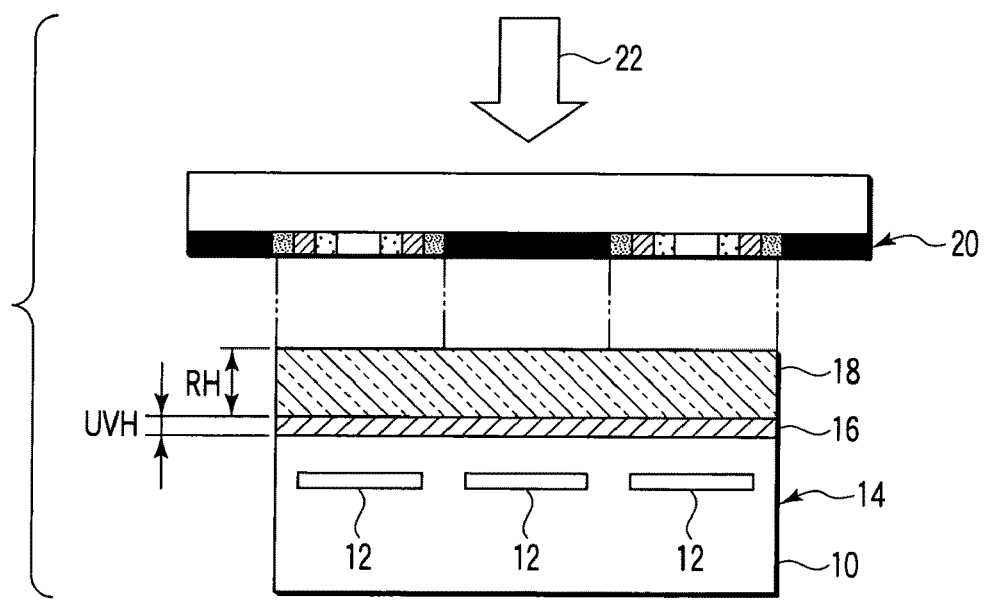
FIG. 1B is a vertical sectional view schematically showing a state where an ultraviolet absorbing layer and a first negative-type color resist layer are formed on the semiconductor substrate of the imaging device in FIG. 1A and then an exposure process is performed by using a halftone mask, in the color imaging device manufacturing method according to the first embodiment of the present invention.

As shown in FIG. 1B, an ultraviolet absorbing layer 16 is formed on a surface of a semiconductor substrate 10 of the imaging device 14 in which the plurality of photoelectric transducers 12 face the surface, and a negative-type color resist layer 18 of a desired color is formed on this layer. In this embodiment, a thickness UVH of the ultraviolet absorbing layer 16 is in a range between approximately 0.1 µm and approximately 0.8 µm, and a thickness RH of the negative-type color resist layer 18 is in a range between approximately 0.5 µm and approximately 1.5 µm.

The negative-type color resist layer 18 is, for example a coloring composition in which a pigment dispersion having a color material (an organic pigment) of a desired color dispersed in an alkali soluble transparent resin and a solvent by a dispersing agent, a photoinitiator, a photopolymerizable monomer, and an organic solvent such as cyclohexane or PGMEA are mixed.

For the negative color resist layer 18, three colors, i.e., green, blue, and red are usually prepared.

Further, in a positive-type color resist layer 18 of the green color, for example, C.I. pigment yellow 150 and C.I. pigment green 36 are added as color materials.

Furthermore, in the negative-type color resist layer 18 of the blue color, for example, C.I. pigment blue 15:6 is added as a color material.

Moreover, in the negative-type color resist layer 18 of the red color, for example, C.I. pigment red 177, C.I. pigment red 254, and C.I. pigment yellow 150 are added as color materials.

An example of a method for manufacturing the negative-type color resist layer 18 will now be explained.

Terms "part" and "%" mean "part by weight" and "% by weight" in the following description.

Preparation of an acrylic resin solution and a pigment dispersion constituting a part of the negative-type color resist layer 18 will now be explained.

It is to be noted that a molecular weight of the resin is a weight-average molecular weight measured by a gel-permeation chromatography (GPC) and converted into polystyrene.

1). Preparation of Acrylic Resin Solution:

800 parts of cyclohexanone were put into a reaction vessel, heating was performed until 100° C. while inputting a nitrogen gas into the reaction vessel, and a mixture of 60.0 parts of 2-hydroxyethyl methacrylate, 60.0 parts of a methacrylic acid, 65.0 parts of methyl methacrylate, 65.0 parts of butyl methacrylate, and 10.0 parts of azobisisobutyronitrile was dropped in one hour while maintaining this temperature to perform a polymerization reaction.

After the end of the dropping, the reaction was further performed for three hours while maintaining the temperature of 100° C. Then, 2.0 parts of azobisisobutyronitrile dissolved by 50 parts of cyclohexanone were added into the reaction vessel, the reaction was further performed for one hour while maintaining the temperature of 100° C., thereby obtaining an acrylic resin solution. A weight-average molecular weight of the acrylic resin was approximately 40000.

After cooling the acrylic resin solution to a room temperature, approximately 2 g of the acrylic resin solution was sampled, the sampled acrylic resin solution was heated at 180° C. for 20 minutes to be dried, and a nonvolatile portion was measured. Cyclohexanone was added in such a manner that the nonvolatile portion in the acrylic resin solution obtained as described above becomes 20% in accordance with a result of this measurement, thereby preparing the acrylic resin solution obtained as described above.

2). Preparation of Pigment Dispersion

The following Table 1 shows an example of compositions for a red pigment dispersion R-1, a green pigment dispersion G-1, and a blue pigment dispersion B-1. Each of these pigment dispersions R-1, G-1, and B-1 was prepared by uniformly agitating and mixing a mixture having the composition for each of these dispersions, then dispersing the mixture for five hours by a sand mill using many glass beads each having a diameter of 1 mm, and then passing the mixture through a filter having a 5-µm mesh.

TABLE 1

Table 1 Prescription of Pigment Dispersion (Part(s))

|  | Red pigment dispersion R-1 | Green pigment dispersion G-1 | Blue pigment dispersion B-1 |
|---|---|---|---|
| PR254 | 9.95 | | |
| PR177 | 1.58 | | |
| GP36 | | 7.82 | |
| PB15:6 | | | 12.00 |
| PY150 | 0.47 | 4.18 | |
| Pigment dispersing agent | 2.40 | 2.40 | 2.40 |
| Acrylic resin solution | 25.60 | 25.60 | 25.60 |
| Organic solvent | 60.00 | 60.00 | 60.00 |
| Total | 100.00 | 100.00 | 100.00 |

In Table 1:
PR254 is a diketopyrrolopyrrole-based pigment (C.I. Pigment Red 254) ("Irgafos Red B-CF" manufactured by Chiba Specialty Chemicals Corp.);
PR177 is an anthraquinone-based pigment (C.I. Pigment Red 177) ("Chromophthal Red A2B" manufactured by Chiba Specialty Chemicals Corp.);
PG36 is a copper-halide-phthalocyanine-based pigment (C.I. Pigment Green 36) ("Lionol Green 6YK" manufactured by TOYO INK MFG. Co., Ltd.);
PB15:6 is a e-type copper-phthalocyanine-based pigment (C.I. Pigment Blue 15:6) ("Heliogen Blue L-6700F" manufactured by BSAF);
PY150 is a nickel-azo-complex-based pigment (C.I. Pigment Yellow 150) ("E4GN" manufactured by LANXESS);
the pigment dispersing agent is "SOLSPAS 20000" manufactured by Lubrizol Japan Ltd.;
the acrylic resin solution is the acrylic resin solution prepared as described above; and
the solvent is cyclohexane.

3). Preparation of Negative-Type Color Resist

Then, each of the red pigment dispersion R-1, green pigment dispersion G-1 and blue pigment dispersion B-1 prepared as described above, together with the acrylic resin solution prepared as described above, the photoinitiator, the photopolymerizable monomer, and the organic solvent, were agitated and mixed to become uniform, and thereafter passed through a filter having a 1-µm mesh, thereby obtaining a red negative-type color resist, a green negative-type color resist, and a blue negative-type color resist.

Here, for example, the photoinitiator includes: an oxymeester-based photopolymerization initiator 1,2-octadione-1-[4-(phenylthio)-, 2-(0-benzoyloxime)], ("Irgacure OXE-01" manufactured by Chiba Specialty Chemicals Corp.); and α-aminoalkylphenone-based photopolymerization initiator 2-(dimethylamino)-2-[(4-methylphenyl)methyl]-1-4[4-(4-morpholinyl)phenyl]-1-butanone, ("Irgacure 379" manufactured by Chiba Specialty Chemicals Corp.).

Additionally, for example, the photopolymerizable monomer includes: trimethylolpropane PO modified triacrylate, ("Aronix M-310" manufactured by Toagosei Co., Ltd.); and dipentaerythritolpenta and hexa-acrylate ("Aronix M-402" manufactured by Toagosei Co., Ltd.).

Further, the organic solvent is, e.g., cyclohexane.

In this embodiment, a color of the negative-type color resist layer 18 that is first formed on the ultraviolet absorbing layer 16 is green.

A plurality of portions on a surface of the green negative-type color resist layer 18 associated with a plurality of photoelectric transducers 12 above which green coloring layers should be formed are subjected to pattern exposure 22 by using a halftone mask 20. The halftone mask 20 has a pattern of gray-scale properties that enables each of the plurality of portions on the green negative-type color resist layer 18 subjected to the pattern exposure by the halftone mask 20 to have a convex hemispherical shape a center of which corresponds to the center of the photoelectric transducer 12 corresponding thereto after development.

Figure 2A:
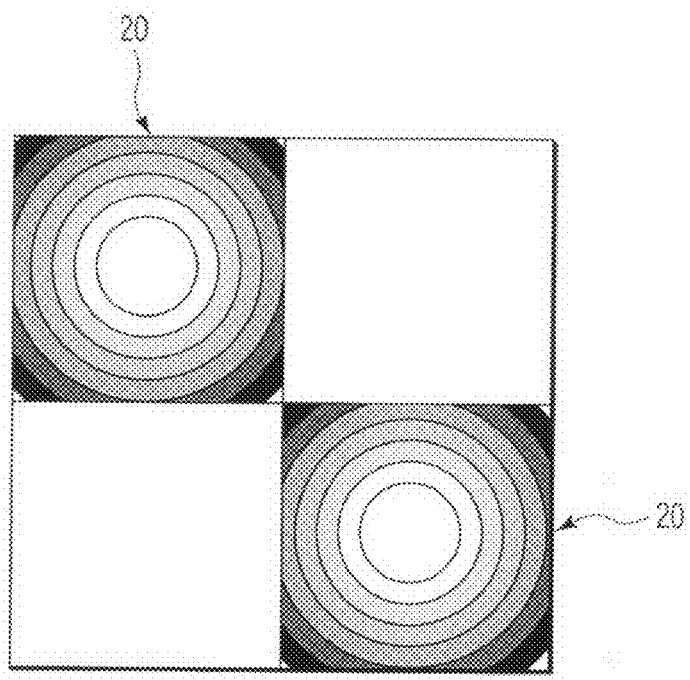
FIG. 2A is a schematic plan view of the halftone mask used in FIG. 1B.
Figure 2B:
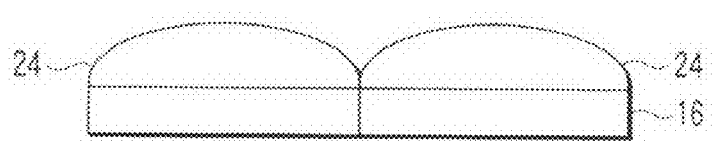
FIG. 2B is an enlarged side view showing each convex hemispherical coloring layer together with the ultraviolet absorbing layer, the convex hemispherical coloring layer being obtained by performing pattern exposure to the surface of the negative-type color resist layer on the ultraviolet absorbing layer in FIG. 1B through the halftone mask shown in FIG. 2A and then carrying out the development process and the film hardening process to the negative-type color resist layer.

FIG. 2A shows a schematic plan view of the halftone mask 20 to be used. The halftone mask usually has a dimension that is larger in four to five times than a dimension of an actually formed pattern and the pattern exposure is performed to be reduced to ¼ to ⅕ in size. Furthermore, the grayscale of the halftone mask is concentrically changed. The grayscale can be changed by adjusting on the halftone mask the number of fine black dots (or white dots) per unit area, which serves as a dimension that is smaller than, e.g., a wavelength of exposure light in, e.g., a reduction to ⅕. As a result, the grayscale where a transmission factor of light is concentrically changed can be provided to the halftone mask.

In the halftone mask 20 used in this embodiment, the number of the white dots is increased toward the center of the plurality of concentric circles around the center of each photoelectric transducer 12, and the transmission factor of light concentrically rises toward the center.

The halftone mask 20 in this embodiment is a four to five-power reticle and has a pattern whose dimension is larger in four to five times than a dimension of a pattern exposed on the surface of the negative-type color resist layer 18. Furthermore, a non-illustrated stepper exposure device is used to expose the surface of the negative-type color resist layer 18 with ¼ to ⅕ in size of the pattern of the halftone mask 20.

Thereafter, when the negative-type color resist layer 18 is developed, only the plurality of portions exposed on the negative-type color resist layer 18, i.e., the plurality of portions associated with the plurality of photoelectric transducers 12 above which the green coloring layers should be formed, remain as first coloring layers 24 of green each having a hemispherical convex end portion 24a around the center of each photoelectric transducer 12 corresponding thereto. And, a peripheral region of the end portion 24a is an inclined surface with a curved surface shape which is continuous toward the top of the end portion 24a from an edge of a side surface 24b, the side surface 24b being substantially perpendicularly erected from the ultraviolet absorbing layer 16 in the first coloring layer 24 and the edge of the side surface 24b being located in the opposite side of the ultraviolet absorbing layer 16, and which protrudes in the opposite side of the photoelectric transducer 12 corresponding thereto.

At this time, in this embodiment, the side surface 24b that is substantially perpendicularly erected from the ultraviolet absorbing layer 16 in the first coloring layer 24 has a height BH of substantially 0.7 μm from the ultraviolet absorbing layer 16 to the edge located in the opposite side of the ultraviolet absorbing layer 16, and the hemispherical convex end portion 24a has a height PH of approximately 0.5 μm from the edge of the side surface 24b to the top.

At last, the first coloring layer 24 formed as described above is subjected to a film hardening process.

Figure 1C:
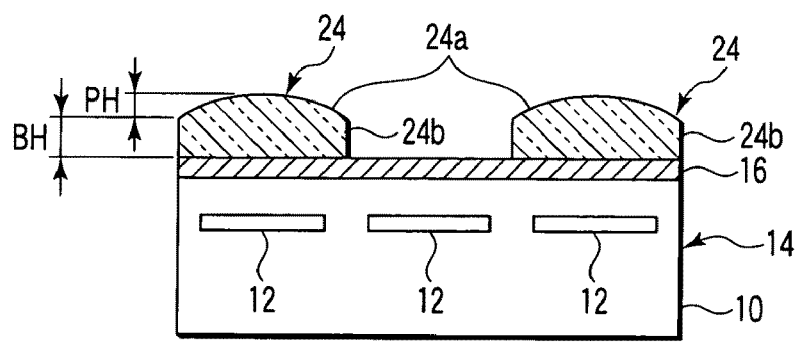
FIG. 1C is a vertical sectional view schematically showing a state where the first negative-type color resist layer exposed in FIG. 1B is developed and then is subjected to a film hardening process to form a first coloring layer having a desired cross-sectional shape.
Figure 1D:
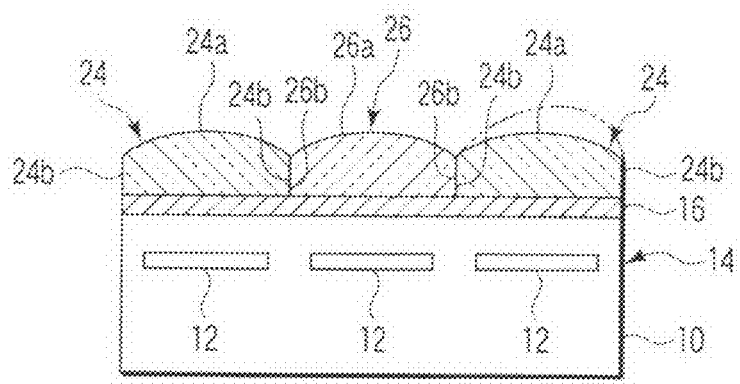
FIG. 1D is a vertical sectional view schematically showing a state where a second negative-type color resist layer of a color different from that of the first negative-type color resist layer in FIG. 1B is provided on the semiconductor substrate including the first coloring layer obtained in FIG. 1C and then the exposure process, the development process, and the film hardening process explained with reference to FIGS. 1B and 1C are applied to the second negative-type color resist layer of the different color, thereby forming the same second coloring layer as the first coloring layer to be adjacent to the first coloring layer.

Then, in this embodiment, the negative-type color resist layer 18 of blue is formed on the ultraviolet absorbing layer 16. The same pattern exposure step, developing step and film hardening step as those when forming the green first coloring layer 24 from the green negative-type color resist layer 18 as explained with reference to FIGS. 1B and 1C are repeated to this blue negative-type color resist layer 18. As a result, a plurality of portions of the blue negative-type color resist layer 18 associated with the plurality of photoelectric transducers 12 above which the blue coloring layers should be formed become second coloring layers 26 of blue each having a convex end portion 26a that is hemispherical around the center of each photoelectric transducer 12 corresponding thereto, as shown in FIG. 1D.

Subsequently, in this embodiment, the red negative-type color resist layer 18 is formed on the ultraviolet absorbing layer 16. The same pattern exposure step, development step and film hardening step as those when forming the green first coloring layers 24 from the green negative-type color resist layer 18 as explained above with reference to FIGS. 1B and 1C are repeated to this red negative-type color resist layer 18. As a result, a plurality of portions of the red negative-type color resist layer 18 associated with the plurality of photoelectric transducers 12 above which the red coloring layers should be formed become third coloring layers of red each having a convex end portion that is hemispherical around the center of each photoelectric transducer 12 corresponding thereto like the green first coloring layer 24 and the blue second coloring layer 26 shown in FIG. 1D. It is to be noted that the red third coloring layer is not shown to avoid complexity of the drawing.

The plurality of green first coloring layers 24, blue second coloring layers 26, and red third coloring layers (not shown) formed in a desired alignment above the plurality of photoelectric transducers 12 of the imaging device 10 through the ultraviolet absorbing layer 16 are adjacent to each other with their side surfaces 24b and 26b being in contact with each other without a gap therebetween, thereby constituting the color filter.

The negative-type color resist layers 18 for respectively forming the first to third coloring layers 24, 26, etc., of different colors contain different pigments, and hence the three negative-type color resist layers 18 for the first to third coloring layers 24, 26, etc., have different luminous sensitivities in exposure and different development degrees in development from each other. Therefore, the three types of halftone masks 20 are used to obtain the first to third coloring layers 24, 26, etc., from the three negative-type color resist layers 18. A grayscale level of each of the three types of halftone masks 20 is of course adjusted to become optimum for formation of each of the first to third coloring layers 24, 26, etc.

As explained above, using the three types of halftone masks 20 having different grayscale levels to obtain the first to third coloring layers 24, 26, etc., from the three negative-type color resist layers 18 enables manufacturing each of the first to third coloring layers 24, 26, etc., to have a dimension with which each demanded function can be most excellently demonstrated.

It is to be noted that the color material to be added in the negative-type color resist layer 18 may be a dye, but an organic pigment is preferable when considering a heat-resisting property and a light-resisting property.

Further, when adding an organic pigment to each negative-type color resist as a color material, considering qualities at various manufacturing steps in manufacture of each of the first to third coloring layers 24, 26, etc., from the negative-type color resist corresponding thereto, it is preferable that a solid ratio of the organic pigment in the negative-type color resist is in a range between 10% and 50%, and especially approximately 20% is preferable. When the solid ratio is lower than 10%, a desired sufficient coloring effect to the negative-type color resist cannot be obtained. Furthermore, when the solid ratio exceeds 50%, processing the convex hemispherical shape, i.e., the hemispherical convex lens shape, and adhesion of either one of the first to third coloring layers 24, 26, etc., to the ultraviolet absorbing layer 16 are degraded, and the coloring layer tends to easily fall off the ultraviolet absorbing layer 16. Moreover, an amount of a residue mainly containing the pigment included in each of the first to third coloring layers 24, 26, etc., obtained after performing the pattern exposure and the development processing to each of the three types of negative color resist layers 18 is increased. Since such an increase of the residue becomes a factor to produce color mixing of light transmitted through each of the first to third coloring layers 24, 26, etc., and noise in an image signal output produced from the photoelectric transducer 12 based on the light transmitted through each of the first to third coloring layers 24, 26, etc., it is undesirable.

A solid ratio of the photoinitiator contained, together with the pigment dispersion, in the negative-type color resist, 7% or above is preferable. When this solid ratio is lower than 7%, the sensitivity is insufficient and the resolving power of the negative-type color resist is decreased.

A solid ratio of photopolymerizable monomer contained, together with the pigment dispersion and the photoinitiator, in the negative-type color resist, approximately 20% is preferable. When the solid ratio is lower than 15%, the polymerization reaction property of the photopolymerizable monomer is lowered and the negative-type color resist layer 18 cannot obtain a desired shape. Additionally, when the solid ratio is more than 25%, an amount of the photopolymerizable monomer that did not react by the pattern exposure is increased, and the photopolymerizable monomer that did not react by the pattern exposure volatilize in the film hardening processing performed after the pattern exposure and the development processing, thereby results in roughness of the surface subjected to the film hardening processing.

Further, it is preferable that an IM ratio (I is the photoinitiator; and M is the photopolymerizable monomer) is in a range between 20% and 50%. When the IM ratio is lower than 20%, a stability of the negative-type color resist with time and adhesion of each of the first to third coloring layers 24, 26, etc. to the ultraviolet absorbing layer 16 are degraded, and the coloring layers tend to easily fall off the ultraviolet absorbing layer 16. When the IM ratio is higher than 50%, the stability of the negative-type color resist with time becomes excellent but an amount of the photopolymerizable monomer that did not react by the pattern exposure is increased, as a result the photopolymerizable monomer that did not react by the pattern exposure volatilize in the film hardening processing performed after the pattern exposure and the development processing, thereby results in surface roughness of each of the first to third coloring layers 24, 26, etc., subjected to the film hardening processing.

It is preferable that the IM amount is 4% or above. When the IM amount is lower than 4%, adhesion of each of the first to third coloring layers 24, 26, etc. to the ultraviolet absorbing layer 16 is degraded, and the coloring layers tend to easily fall off the ultraviolet absorbing layer 16.

When the solid ratio of the organic pigment in the negative-type color resist is the above-explained value, a minimum thickness of each of the first to third coloring layers 24, 26, etc., required to obtain a desired spectral characteristic is approximately 0.4 μm.

A thickness of each of a plurality of coloring layers of a flat color filter for a conventional color imaging device is approximately 1 μm. Therefore, in the color imaging device according to this embodiment, it is preferable that a thickness BH (see FIG. 1C) of a portion of each of the first to third coloring layer portions 24, 26, etc., (i.e., a portion surrounded by the side surfaces 24$b$ or 26$b$ that are erected from the ultraviolet absorbing layer 16) that carry out the same function as that of each of the plurality of coloring layer of the flat color filter for the conventional color imaging device is n a range from 0.4 μm to 1.0 μm when the solid ratio of the organic pigment in each negative-type color resist in the range between 10% to 50% as described above.

Furthermore, in the color imaging device according to this embodiment, it is preferable that a height PH (see FIG. 1C) of each of the end portions 24$a$, 26$a$, etc., each formed into the convex semicircular shape and used as the microlens in each of the first to third coloring layers 24, 26, etc., to improve a light collecting power to the photoelectric transducer 12 with which each of the first to third coloring layers 24, 26, etc., is associated, is in a range between 1.8 μm to 0.1 μm.

The height PH is a value with which each of the end portions 24$a$, 26$a$, etc., each formed into the convex semicircular shape and used as the microlens in each of the first to third coloring layers 24, 26, etc., can maximize the light collecting power to the photoelectric transducer 12 corresponding thereto in a following situation wherein: a depth at which each photoelectric transducer is provided is in the range between 5 μm and 6 μm in the semiconductor substrate of the conventional imaging device; a depth of each photoelectric transducer in the semiconductor substrate is in a range between 2 μm and 3 μm in a case where each photoelectric transducer is formed as close to the semiconductor substrate as possible as explained in the above described two documents (JP-A 2005-217439 (KOKAI) and JP-A 2005-223084 (KOKAI)); and a thickness of the ultraviolet absorbing layer 16 and the thickness of each negative-type color resist layer 18 formed above each photoelectric transducer 12 in the semiconductor substrate 10 are considered.

First Modification of the First Embodiment

In the color imaging device according to the first embodiment described above, each of the end portions 24$a$, 26$a$, etc., of the first to third coloring layers 24, 26, etc., provided on the surface of the semiconductor substrate 10 through the ultraviolet absorbing layer 16 to associate with each desired photoelectric transducer 12 is formed into the convex hemispherical shape as shown in FIG. 1D. However, when a sensitivity center of the photoelectric transducer 12 is arranged to deviate from a center of a pixel corresponding thereto, each of these end portions 24$a$, 26$a$, etc., can be formed to have an asymmetrical vertical section as shown by two dots chain line in FIG. 1D in order to condense light at the sensitivity center of the photoelectric transducer 12 corresponding thereto.

Forming each of the end portions 24$a$, 26$a$, etc., of the first to third coloring layers 24, 26, etc., to have such an asymmetrical vertical section can be readily achieved by making a distribution of black dots (or white dots) in the halftone mask 20 into an asymmetrical shape, the dots distribution being used for pattern exposure when creating each of the convex hemispherical end portions 24a, 26a, etc., of the first to third coloring layers 24, 26, etc., from the negative color resist layers 18.

Arranging the sensitivity center of each photoelectric transducer 12 to deviate from the center of the pixel corresponding thereto is carried out for, e.g., compensating insufficiency of a light quantity of each photoelectric transducer 12 arranged at a peripheral portion of the semiconductor substrate of the semiconductor device 10 or avoiding an interference with an arrangement of wiring in each pixel due to miniaturization of each pixel of the semiconductor device 10.

Second Modification of the First Embodiment

Further, in the color imaging device according to the first embodiment, each of the first to third coloring layers 24, 26, etc., provided on the surface of the semiconductor substrate 10 through the ultraviolet absorbing layer 16 to associate with each photoelectric transducer 12 is formed by using the negative-type color resist. However, each of the first to third coloring layers 24, 26, etc., can be formed by using a positive-type color resist. A halftone mask used in a pattern exposure for forming each of the first to third coloring layers 24, 26, etc., from the positive-type color resist layer has a monochrome grayscale reversed from that of the halftone mask 20 used in the pattern exposure for forming each of the first to third coloring layers 24, 26, etc., from the negative-type color resist layer 18. That is, the number of the black dots is increased toward the center of the concentric circle, and a transmission factor of light is thereby concentrically reduced toward the center.

For example, when the positive-type color resist layer is formed on the ultraviolet absorbing layer 16 having a thickness UVH of approximately 0.1 μm, a thickness RH of the positive color resist layer is set to approximately 1.2 μm.

The positive-type color resist layer is produced by, for example adding a color material of a desired color to a positive-type photosensitive resin and further adding an organic solvent such as cyclohexane or PGMEA, an acid decomposing resin, a photo acid generator, and a dispersing agent.

As the positive-type color resist layer, three colors, i.e., green, blue, and red are usually prepared.

Furthermore, in the green positive-type color resist layer, for example, C. I. pigment yellow 150, C. I. pigment green 36, and C. I. pigment green 7 are added as color materials.

Moreover, in the blue positive color resist layer, for example, C. I. pigment blue 15:6 and C. I. pigment violet 23 are added as color materials.

Additionally, in the red positive color resist layer, for example, C. I. pigment red 177, C. I. pigment red 48:1, and C. I. pigment yellow 139 are added as color materials.

The positive-type photosensitive resin is a combination of, for example a novolac resin and a quinonediazido compound, and an alkaline soluble vinyl polymer can be further added to this combination.

Besides, the positive-type photosensitive resin may be a polyvinyl phenol derivative or an acrylic resin.

The color material may be an organic pigment or a dye of any other color than that described above.

Moreover, an ester lactate may be added to the organic solvent.

The acid decomposing resin is a resin having a group that can be converted into an alkaline soluble group (e.g., a calboxyl group or a phenolic hydroxyl group) when coming into contact with an acid.

Additionally, the photo acid generator is a compound that generates an acid when irradiated with light, and one or more types of such compounds can be used. Further, as the photo acid generator, for example, a chloride with a halogen ion of onium, a $BF_4$ ion, a $PF_6$ ion, an $AsF_6$ ion, an $SbF_6$ ion, a $CF_3SO_3$ ion, or the like, an organic halide compound, a naphthoquinone diazido sulfonic acid compound, or a photo sulfonic acid generating compound can be used.

Each of the green positive-type color resist layer, the blue positive-type color resist layer, and the red positive-type color resist layer is coated on the semiconductor substrate 10 through the ultraviolet absorbing layer 16 in the above mentioned order, and then subjected to a pattern exposure, a development, and a film hardening process, and green coloring layers, blue coloring layers, and red coloring layers are formed at a plurality of predetermined positions on the semiconductor substrate 10 through the ultraviolet absorbing layer 16, thereby constituting a color filter.

Each of the green coloring layer, the blue coloring layer, and the red coloring layer formed from the green positive-type color resist layer, the blue positive-type color resist layer, and the red positive-type color resist layer has the same shape and dimensions as those of each of the green coloring layer 24, the blue coloring layer 26, and the red coloring layer (not shown) formed from the green negative-type color resist layer 18, the blue negative-type color resist layer 18, and the red negative-type color resist layer in the above described first embodiment, thus carrying out the same function.

The color material added to the positive-type color resist may be a dye, but an organic pigment is preferable when considering a heat-resisting property and a light-resisting property.

Further, when an organic pigment is added to the positive-type color resist as a color material, considering qualities at various manufacturing steps in manufacture of each coloring layer from the positive-type color resist layer, it is preferable that a solid ratio of the organic pigment in the positive-type color resist is in a range between 30% and 50%, and especially approximately 40% is preferable. When the solid ratio is lower than 30%, a desired sufficient coloring effect to the positive-type color resist cannot be obtained. And, when the solid ratio exceeds 50%, processing the positive-type color resist layer to obtain a convex hemispherical shape, i.e., a convex lens shape, becomes difficult. Furthermore, an amount of a residue mainly including the pigment contained in the coloring layer formed from the positive-type color resist layer by the pattern exposure and the development processing is increased. Therefore, color mixing occurs in a light beam transmitted through such a coloring layer, and the light beam transmitted through such a coloring layer generates noise in an image signal output produced in the photoelectric transducer.

Additionally, when the solid ratio of the organic pigment in the positive-type color resist is that as described above, a minimum thickness of each of the green, blue, and red coloring layers required to obtain a desired spectral characteristic is approximately 0.4 μm.

As explained above, the thickness of each of the plurality of coloring layers of the flat color filter for the conventional color imaging device is approximately 1 μm. Therefore, in the color imaging device according to this modification where the positive-type color resists are used to form the plurality of coloring layers of the color filter, it is preferable that a thickness BH (see FIG. 1C) of a part of each of the green, blue, and red coloring layer (i.e., a portion surrounded by the side surfaces 24b or 26b that are erected from the ultraviolet absorbing layer 16), the part carrying out the same function as each of the plurality of coloring layers of the color filters for the conventional color imaging device, is in a range between 0.4 μm and 0.9 μm, and more preferably in a range between 0.5 μm to 0.7 μm, when the solid ratio of the organic pigment in each positive-type color resist is in a range between 30% and 50%.

Furthermore, in the color imaging device according to this modification where the positive-type color resists are used to form the plurality of coloring layers of the color filter, like the color imaging device according to the first embodiment where the negative-type color resists 18 are used to form the plurality of coloring layers 24, 26, etc., of the color filter, it is preferable that a height PH (see FIG. 1C) of the end portion of each of the plurality of coloring layers that is formed into the convex hemispherical shape and used as the microlens is in a range between 1.8 μm and 0.1 μm in order to improve a light collecting power to the photoelectric transducer corresponding thereto.

Second Embodiment

Next, with reference to FIGS. 3A to 4B, it will be explained in detail how a color filter is formed in an imaging device by a color imaging device manufacturing method according to a second embodiment of the present invention to manufacture a color imaging device according to a second embodiment of the present invention.

Figure 3A:
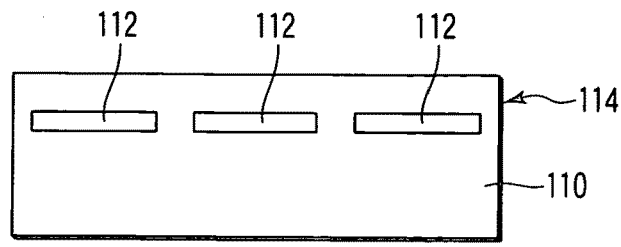
FIG. 3A is a schematic vertical sectional view of an imaging device before color filters are formed by a color imaging device manufacturing method according to a second embodiment of the present invention.

FIG. 3A shows a schematic vertical cross-sectional view of an imaging device 114 in which a plurality of CMOS photoelectric transducers 112 are provided in a semiconductor substrate 110. It is to be noted that the photoelectric transducer is the CMOS photoelectric transducer 112 in this embodiment, but the photoelectric transducer may be a CCD photoelectric transducer in a concept of the present invention. A configuration of such an imaging device 114 is well known, and it will not be explained in further detail here. The configuration of this imaging device 114 is the same as the configuration of the imaging device 14 used in the color imaging device manufacturing method according to the first embodiment of the present invention described above with reference to FIGS. 1A to 2B.

It is to be noted that a pixel size in a plan view to which the present invention can be applied is in a range between approximately 10 μm and approximately 1 μm, and it is in a range between approximately 3.0 μm and approximately 1.5 μm in this embodiment.

Figure 3B:
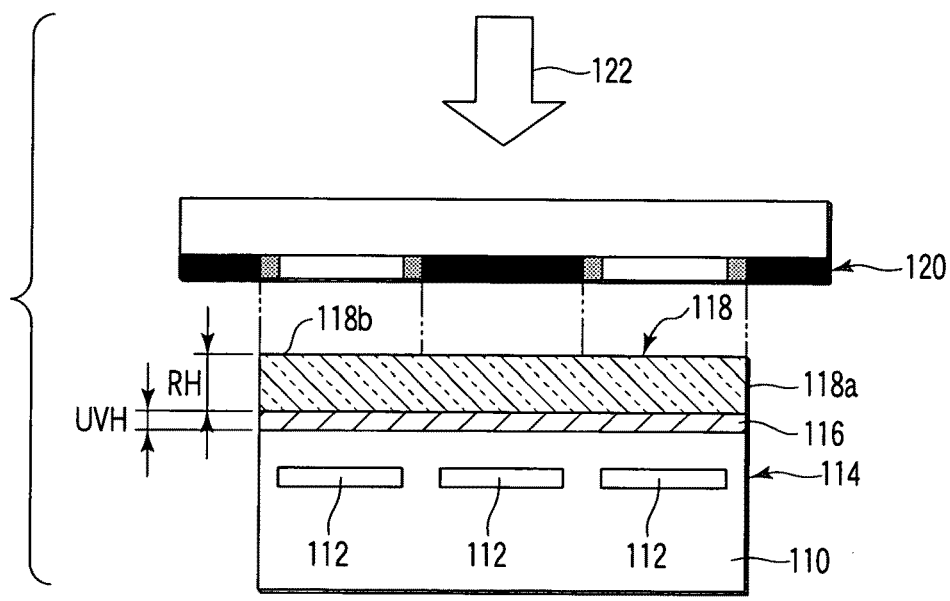
FIG. 3B is a vertical sectional view schematically showing a state where an ultraviolet absorbing layer and a first negative-type color resist layer are formed on a semiconductor substrate of the imaging device in FIG. 3A and then an exposure process is performed by using a halftone mask, in the color imaging device manufacturing method according to the second embodiment of the present invention.
Figure 3C:
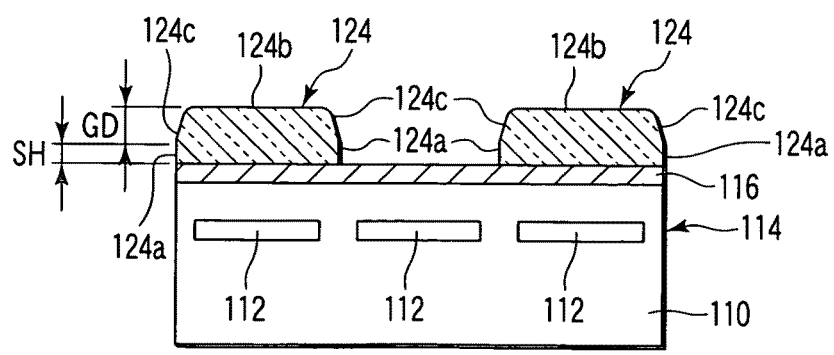
FIG. 3C is a vertical sectional view schematically showing a state where the first negative-type color resist layer exposed in FIG. 3B is developed and then is subjected to a film hardening process to form a first coloring layer having a desired cross-sectional shape.

Next, as shown in FIG. 3B, an ultraviolet absorbing layer 116 is formed above surfaces of the plurality of photoelectric transducers 112 in the imaging device 114, and a negative-type color resist layer 118 of a desired color is further formed thereon. The ultraviolet absorbing layer 116 and the negative-type color resist layer 118 in this embodiment are the same as the ultraviolet absorbing layer 16 and the negative-type color resist layer 18 formed on the surface of the imaging device 14 used in the color imaging device manufacturing method according to the first embodiment.

As the negative-type color resist layer 118, three colors, i.e., green, blue, and red are usually prepared.

In this embodiment, a color of the negative-type color resist layer 118 that is first formed on the ultraviolet absorbing layer 116 is green.

A plurality of portions on a surface of the green negative-type color resist layer 118 associated with a plurality of photoelectric transducers 112 above which green coloring layers should be formed are subjected to exposure 122 by using a halftone mask 120. The halftone mask 120 has grayscale properties of a pattern to form an inclined surface that is continuous from an end of a side surface 118a, the side surface 118a being erected perpendicularly from the ultraviolet absorbing layer 116 on the semiconductor substrate 110 around the photoelectric transducer 112 corresponding thereto and the end of the side surface 118a being located in the opposite side of the semiconductor substrate 110 and ultraviolet absorbing layer 116, toward an end of the negative-type color resist layer 118 located in the opposite side of the ultraviolet absorbing layer 116 at each of the plurality of portions of the green negative-type color resist layer 118 subjected to a pattern exposure by the halftone mask 120.

Figure 4A:
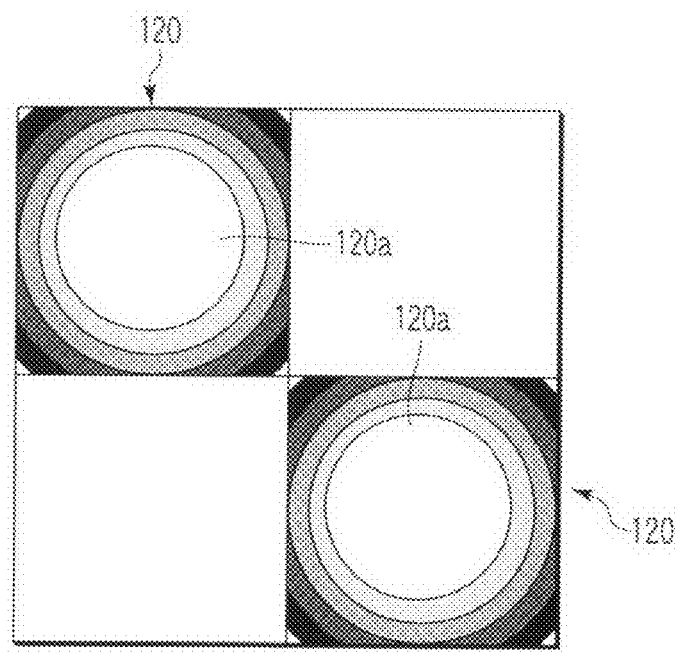
FIG. 4A is a schematic plan view of the halftone mask used in FIG. 3B.

FIG. 4A shows a schematic plan view of the halftone mask 120 to be used. The halftone mask usually has a dimension that is larger in four to five times than a dimension of an actually formed pattern and the pattern exposure is performed to be reduced to ¼ to ⅕ in size. In this embodiment, the halftone mask 120 has an opening forming region 120a as a large circular light transmitting portion and a grayscale changing region that sequentially concentrically changes a grayscale to the opening forming region 120a, the opening forming region 120a and the grayscale changing region being arranged concentrically to the center of the photoelectric transducer 112. The concentric grayscale is formed by adjusting on the halftone mask the number of fine black dots (or white dots) per unit area, which serves as a dimension that is smaller than, e.g., a wavelength of exposure light in, e.g., a reduction to ⅕. As a result, the concentric grayscale where a transmission factor of light is concentrically changed can be provided to the halftone mask.

In the halftone mask 120 used in this embodiment, the number of the white dots is increased toward the center of the plurality of concentric circles around the center of each photoelectric transducer 12, and the transmission factor of light concentrically rises toward the center opening forming region 120a.

The halftone mask 120 in this embodiment is a four to five-power reticle and has a pattern whose dimension is larger in four to five times than a dimension of a pattern exposed on the surface of the negative-type color resist layer 118. Furthermore, a non-illustrated stepper exposure device is used to expose the surface of the negative-type color resist layer 118 with ¼ to ⅕ in size of the pattern of the halftone mask 20.

Thereafter, when the negative-type color resist layer 118 is developed, only the plurality of portions exposed on the negative-type color resist layer 118, i.e., the plurality of portions associated with the plurality of photoelectric transducers 112 above which the green coloring layers should be formed, remain as first coloring layers 24 of green around the center of each photoelectric transducer 12 corresponding thereto.

Figure 4B:
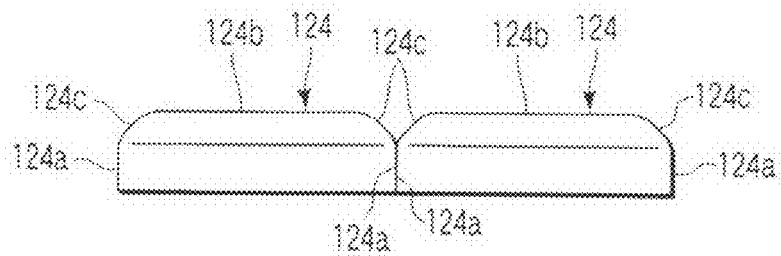
FIG. 4B is an enlarged side view showing each convex hemispherical coloring layer together with the ultraviolet absorbing layer, the convex hemispherical coloring layer being obtained by performing pattern exposure to the surface of the negative-type color resist layer on the ultraviolet absorbing layer in FIG. 3B through the halftone mask shown in FIG. 4A and then carrying out the development process and the film hardening process to the negative-type color resist layer.

FIG. 4B shows a schematic side view of the coloring layers 124 obtained by developing the positive-type color resist layer 118 subjected to a pattern exposure by such a halftone mask 120.

The first coloring layer 124 has an upset-dish-like shape including a side surface 124a perpendicular to the surface of the semiconductor substrate 110 and an inclined surface 124c which is inclined to approach a rim of a flat end portion 124b of the first coloring layer 124 as getting closer to the flat end portion 124b of the first coloring layer 124 located in the opposite side of semiconductor substrate 110 from an end of the side surface 124a located in the opposite side of the semiconductor substrate 110.

At this time, in this embodiment, a depth GD of the inclined surface 124c from the flat end portion 124b of the first coloring layer 24 to the end of the side surface 124a located in the opposite side of the semiconductor substrate 110 is approximately 0.4 μm, and a height SH of the side surface 124a from the end of the side surface 124a located in the opposite side of the semiconductor substrate 110 to the ultraviolet absorbing layer 116 is approximately 0.5 μm.

At last, the first coloring layer 124 formed as described above is subjected to a film hardening processing.

Figure 3D:
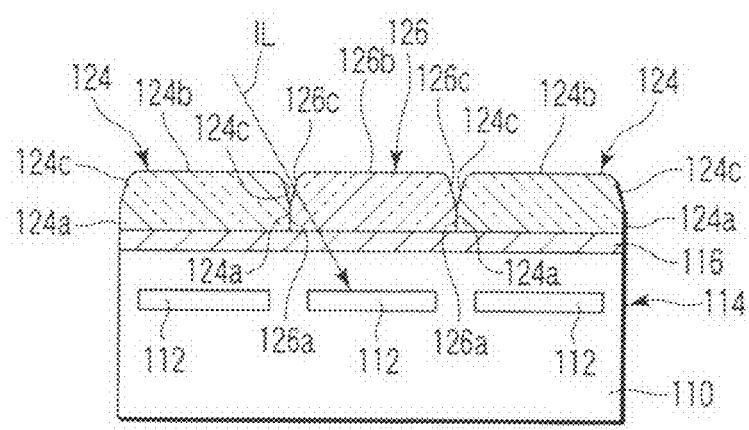
FIG. 3D is a vertical sectional-view schematically showing a state where a second negative-type color resist layer of a color different from that of the first negative-type color resist layer in FIG. 3B is provided on the semiconductor substrate with the first coloring layer obtained in FIG. 3C and then the exposure process, the development process, and the film hardening process explained with reference to FIGS. 3B and 3C are applied to the second negative-type color resist layer of the different color, thereby forming the same second coloring layer as the first coloring layer to be adjacent to the first coloring layer.

Then, the blue negative-type color resist layer 118 is formed on the ultraviolet absorbing layer 116 in this embodiment. The same pattern exposure step, development step, and film hardening step as those when forming the green first coloring layer 124 from the green negative-type color resist layer 118 as described above with reference to FIGS. 3B and 3C are repeated to this blue negative-type color resist layer 118. As a result, in the blue negative-type color resist layer 118, each of a plurality of portions associated with the plurality of photoelectric transducers 112 above which blue coloring layers should be formed becomes a blue second coloring layer 126 having an upset-dish-like shape having a flat end portion 126b around the center of the photoelectric transducer 112 corresponding thereto, as shown in FIG. 3D.

The second coloring layer 126 also includes a side surface 126a perpendicular to the surface of the semiconductor substrate 110 and an inclined surface 126c which is inclined to approach a rim of the flat end portion 126b of the second coloring layer 126 as getting closer to the flat end portion 126b of the second coloring layer 126 located in the opposite side of the semiconductor substrate 110 from an end of the side surface 126a located in the opposite side of the semiconductor substrate 110.

Then, the red negative-type color resist layer 118 is formed on the ultraviolet absorbing layer 116 in this embodiment. The same pattern exposure step, development step, and film hardening step as those when forming the green first coloring layers 124 from the green negative-type color resist layer 118 as described above with reference to FIGS. 3B and 3C are repeated to this red negative-type color resist layer 118. As a result, in the red negative-type color resist layer 118, each of a plurality of portions associated with the plurality of photoelectric transducers 112 above which red coloring layers should be formed becomes a red third coloring layer having an upset-dish-like shape including a flat end portion around the center of the photoelectric transducer 112 corresponding thereto, like the green first coloring layer 124 or the blue second coloring layer 126 as shown in FIG. 3D. It is to be noted that the red third coloring layer is not shown to avoid complexity of the drawing.

The third coloring layer also includes a side surface perpendicular to the surface of the semiconductor substrate 110 and an inclined surface which is inclined to approach a rim of the flat end portion of the third coloring layer as getting closer to the flat end portion of the third coloring layer located in the opposite side of the semiconductor substrate 110 from an end of the side surface located in the opposite side of the semiconductor substrate 110, like each of the first coloring layer 124 and the second coloring layer 126.

The plurality of green first coloring layers 124, blue second coloring layers 126, and red third coloring layers (not shown) formed in a desired alignment above the plurality of photoelectric transducers 112 through the ultraviolet absorbing layer 116 in the imaging device 114 with their side surfaces 124a and 126a being in contact with each other without a gap therebetween configure a color filter.

In each of the green first coloring layer 124, blue second coloring layer 126, and red third coloring layer (not shown), an intersectional region of each of the flat end portions 124b, 126b, etc., and each of the inclined surfaces 124c, 126c, etc., is often rounded in the development step, and each of the inclined surfaces 124c, 126c, etc., also often has a curved surface shape protruding toward the opposite side of each photoelectric transducer 112 with which each of the first coloring layer 124, the second coloring layer 126, and the third coloring layer (not shown) is associated. But, these configurations have no problem as long as the object intended by the present invention can be achieved. Moreover, it is also needless to say that a degree of perpendicularity of each of the side surfaces 124a, 126a, etc., of the first coloring layer 124, the second coloring layer 126, and the third coloring layer (not shown) to the surface of the semiconductor substrate 110 is allowed to have a slight inclination as long as the object intended by the present invention can be achieved.

Pigments contained in the negative-type color resist layers 118 used to form the first to third coloring layers 124, 126, etc., of different colors are different from each other, and the three negative-type color resist layers 118 for the first to third coloring layers 124, 126, etc., thereby have different photosensitive degrees in exposure or different development degrees in development. Therefore, the three types of halftone masks 120 are used to obtain the first to third coloring layers 124, 126, etc., from the three negative-type color resist layers 118. A grayscale level of each of the three types of halftone masks 120 is optimally adjusted to form each of the first to third coloring layers 124, 126, etc. to be formed.

Using the three types of halftone masks 120 having different grayscale levels to obtain the first to third coloring layers 124, 126, etc., from the three negative-type color resist layers 118 enables manufacturing each of the first to third coloring layers 124, 126, etc., to have a dimension that can most excellently demonstrate each demanded function.

In the color imaging device according to the third embodiment, positive-type color resists can be used to create the first to third coloring layers 124, 126, etc., like the second modification of the first embodiment.

Although a color material added to a positive-type color resist layer 118 may be a dye, an organic pigment is preferable when a considering heat-resisting property and a light-resisting property.

Additionally, when adding an organic pigment in the positive-type color resist layer 118 as a color material, a solid ratio of the organic pigment in the positive-type color resist layer 118 is preferably in a range between 30% and 50%, and especially approximately 40% is preferable like the second modification of the first embodiment.

Further, when such a solid ratio of the organic pigment in the positive-type color resist layer 118 is applied, a minimum thickness of each of the coloring layers 124, 126, etc., required to obtain a desired spectral characteristic is approximately 0.4 μm, like the second modification of the first embodiment.

As described above, the thickness of each of the plurality of coloring layers of the flat color filter for the conventional color imaging device is approximately 1 μm. Therefore, when the positive-type color resists are used to form the plurality of coloring layers of the color filter, it is preferable that a thickness SH (see FIG. 3C) of a portion of each of the green, blue, and red coloring layers (i.e., the portion surrounded by the side surface 124a or 126a that is erected from the ultraviolet absorbing layer 116), the portion carrying out the same functions as each of the plurality of coloring layers of the flat color filter for the conventional color imaging device, is in a range between 0.4 μm and 0.9 μm or most preferably in a range between 0.5 μm and 0.7 μm, if the solid ratio of the organic pigment in each positive-type color resist is in the range between 30% and 50%.

Furthermore, in a case where either of the negative-type color resist and the positive-type color resist is used to form the plurality of coloring layers 124, 126, etc., of the color filter, in order to prevent a part of a light beam transmitted through the adjacent coloring layer from producing color mixing, it is preferable that each of the inclined surfaces 124c, 126c, etc., that are continuous in a side of each of the side surfaces 124a, 126a, etc., of the coloring layers 124, 126, etc. being apart from the semiconductor substrate 100, has a depth from each of the flat end portions 124a, 126a, etc., of the plurality of the coloring layers 124, 126, etc., falling within a range between 0.6 μm to 0.1 μm. Moreover, a thickness of each of the plurality of coloring layers 124, 126, etc., is selected to become equal to or less than approximately 1 μm that is a thickness of the conventional flat color filter, by adding the minimum thickness 0.4 μm of each of the side surfaces 124a, 126a, etc., required for each of the plurality of coloring layers 124, 126, etc., to obtain a desired spectral characteristic.

Additionally, the imaging device 114 used in this embodiment can be an imaging device having a regular configuration including a CMOS imaging device or a CCD imaging device that is conventionally and usually used or it may be an imaging device having a configuration where the photoelectric transducers 112 are arranged at positions close to the surface of the semiconductor substrate 110 in the semiconductor substrate 110 as compared with the imaging device having the conventionally and usually used regular configuration, to increase a light quantity entering each photoelectric transducer 112.

Further, since light enters each photoelectric transducer in the imaging device having the latter configuration at a wider angle as compared with the photoelectric transducer in the former imaging device having the conventionally extensively used regular configuration, it is possible to further efficiently receive a benefit of the color mixing avoiding effect for each of the plurality of coloring layers 124, 126, etc., of the color filter by forming each of the inclined surfaces 124c, 126c, etc., inclined toward each of the rims of the flat end portions 124b, 126b, etc., from each of the ends of the side surfaces 124a, 126a, etc., located in the opposite side of the semiconductor substrate 110.

Figure 8:
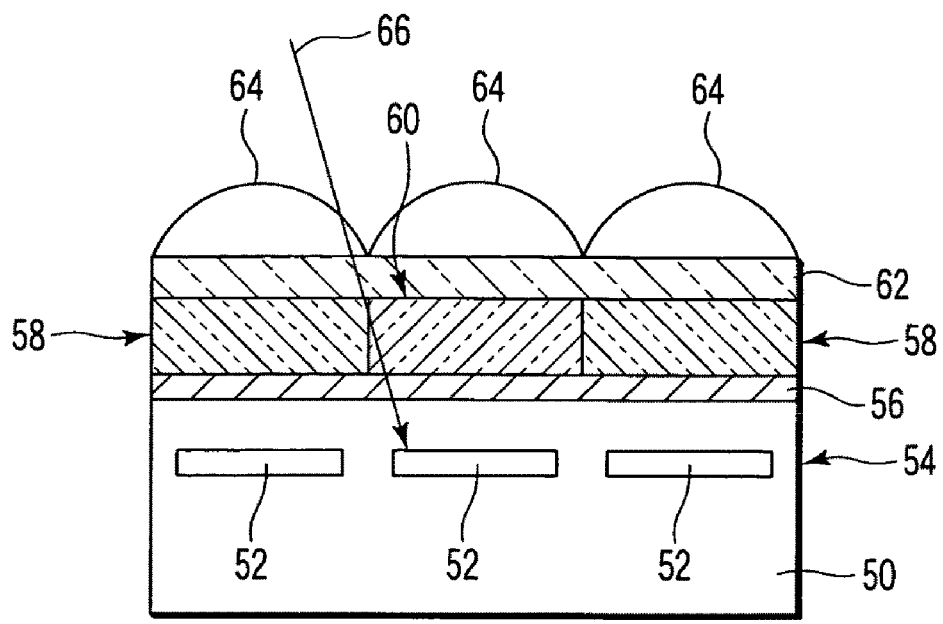
FIG. 8 is a schematic vertical sectional view of a conventional color imaging device in which microlenses are arranged on color filters to associate with photoelectric transducers to improve the luminous sensitivity of the imaging device.
Figure 9:
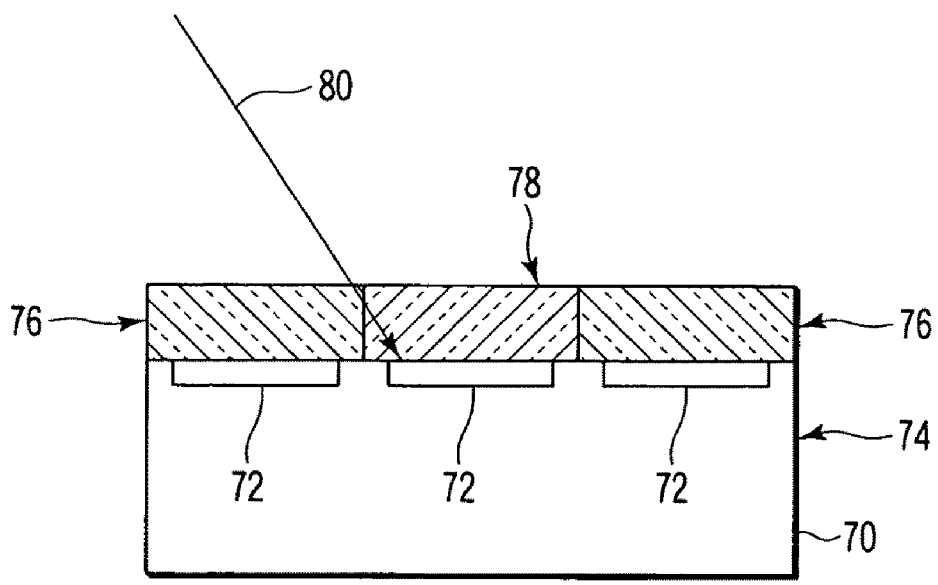
FIG. 9 is a schematic vertical sectional view of a conventional color imaging device in which photoelectric transducers are arranged at positions as close to a surface of a semiconductor substrate as possible in the semiconductor substrate of the imaging device to improve the luminous sensitivity of the imaging device.

In the color imaging device according to the second embodiment and shown in FIG. 3(D) and having the above described configuration, a light beam IL that has obliquely entered a portion of each of the plurality of coloring layers 124, 126, etc., of the color filter, the portion locating near a coloring layer adjacent thereto, can enter each of the coloring layers 124, 126, etc., without transmitting through a peripheral portion of each of the flat end portions 124b, 126b, etc., of the adjacent coloring layers 124, 126, etc., owing to each of the inclined surfaces 124c, 126c, etc., of the adjacent coloring layers 124, 126, etc. Therefore, as different from the conventional color imaging device described above with reference to FIG. 8 and FIG. 9, color mixing does not occur in a light beam that enters each of the coloring layers 124, 126, etc.

Third Embodiment

Next, with reference to FIGS. 5A and 5B, a color imaging device manufacturing method according to a third embodiment will be explained, the manufacturing method forming a plurality of microlenses on the color filter including the plurality of coloring layers 124, 126, etc., to associate with the plurality of coloring layers 124, 126, etc., in a color imaging device manufactured by the color imaging device manufacturing method according to the second embodiment of the present invention explained with reference to FIGS. 3A to 4B.

Figure 5A:
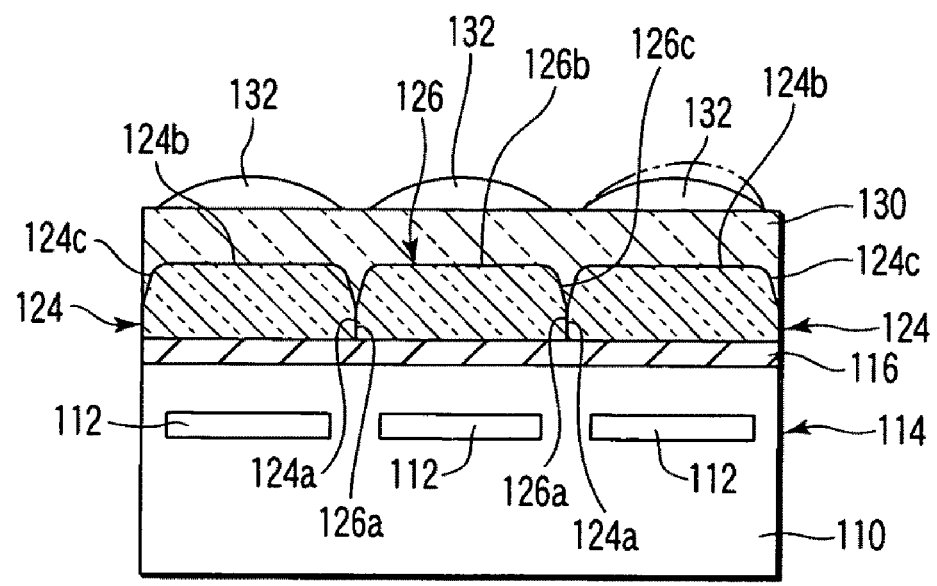
FIG. 5A is a vertical sectional view schematically showing a microlens formation preparing step in a color imaging device manufacturing method according to a third embodiment of the present invention, where microlenses are formed on the color filters of the color imaging device manufactured by the color imaging device manufacturing method according to the second embodiment of the present invention and explained with reference to FIGS. 3A to 4B.

In this third embodiment, as shown in FIG. 5A, a flattening layer 130 of a transparent resin is formed on flat end portions 124b, 126b, etc., of a plurality of coloring layers 124, 126, etc., in a color imaging device manufactured by the color imaging device manufacturing method according to the first embodiment. In this embodiment, the flattening layer 130 has a thickness of approximately 1 μm, and is formed of, for example a thermosetting acrylic transparent resin. This flattening layer 130 fills grooves created between inclined surfaces 124c, 126c, etc., continuous with side surfaces 124a, 126a, etc., of the plurality of coloring layers 124, 126, etc., and provides a flat surface on the plurality of coloring layers 124, 126, etc.

For example, a phenol resin having a thermal reflow property is applied to the flat surface of the flattening layer 130 by for example a spin coating method, thereby forming a non-illustrated lens mother model layer. In this embodiment, the non-illustrated lens mother model layer has a thickness of approximately 0.4 μm.

Furthermore, this lens mother model layer is subjected to a pattern exposure and a development in accordance with a known photolithography technology to obtain a predetermined pattern. By heating this predetermined pattern to subject it to thermal reflow, each hemispherical lens mother model is formed on the surface of the flattening layer 130 to match with the center of each of the plurality of coloring layers 124, 126, etc.

Then, the flattening layer 130 is dry-etched by a known dry etching device utilizing a fluorocarbon gas, for example $CF_4$ or $C_3F_8$ as an etching gas, with each lens mother model 132 being used as a mask. Subsequently, a shape of each lens mother model is transferred to the flattening layer 130 to process the flattening layer 130, thereby forming each microlens 134 that improves a light collecting power to each photoelectric transducer 12 associated with each of the plurality of coloring layers 124, 126, etc., as shown in FIG. 5B.

In this embodiment, the microlens 134 has a height of approximately 0.5 μm. Further, the dry etching to the flattening layer 130 is stopped before it reaches the respective inclined surfaces 124c, 126c, etc., of the plurality of coloring layers 124, 126, etc., thus avoiding surface roughness of the inclined surfaces 124c, 126c, etc., of the plurality of coloring layers 124 and 126 caused by the dry etching.

As a result, each of the plurality of coloring layers 124, 126, etc., including the continuous inclined surfaces 124c, 126c, etc., at the ends of the side surfaces 124a, 126a, etc., located in the opposite side of the semiconductor substrate 110 can sufficiently demonstrate the original spectral characteristic of each of the plurality of coloring layers 124, 126, etc.

Moreover, when the flattening layer 130 is formed of a resin having a benzene ring as a bone structure or has an ultraviolet absorber having a benzene ring added therein, the surface roughness caused by the dry etching can be suppressed. Therefore, an optical performance of each microlens 134 formed from the flattening layer 130 by the dry etching can be further improved.

Figure 5B:
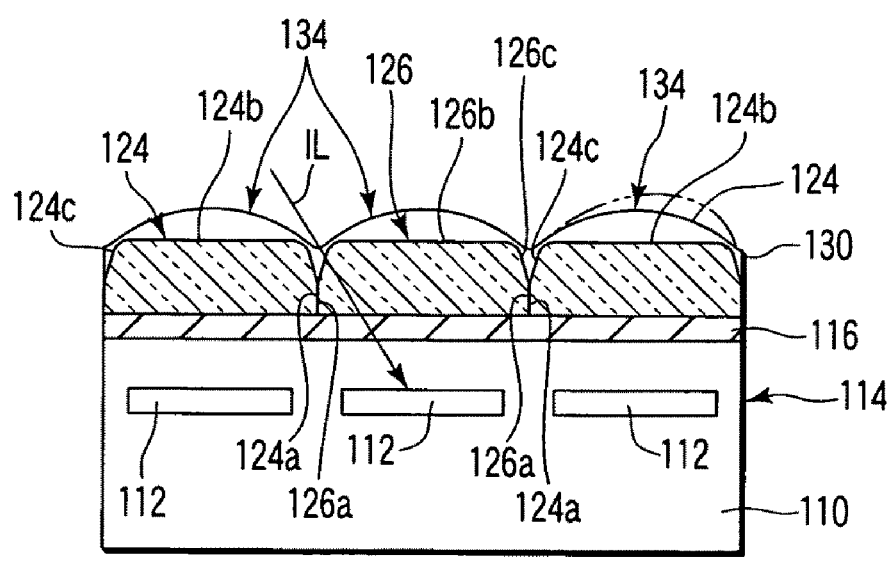
FIG. 5B is a vertical sectional view schematically showing a state where the microlenses are formed on the color filters of the color imaging device manufactured by the color imaging device manufacturing method according to the second embodiment of the present invention and explained with reference to FIGS. 3A to 4B after the microlens formation preparing step of FIG. 5A is performed in the color imaging device manufacturing method according to the third embodiment of the present invention.

Additionally, in the color imaging device shown in FIG. 5B, manufactured by the manufacturing method, according to the third embodiment and having the above described configuration, a light beam IL that has obliquely entered a portion of each of the plurality of coloring layers 124, 126, etc., the portion being adjacent to the neighboring one of the coloring layers 124, 126, etc., can enter each of the plurality of coloring layers 124, 126, etc., without being transmitted through a peripheral portion of each of the flat end portions 124b, 126b, etc., of the neighboring one of the coloring layers 124, 126, etc., owing to the inclined surfaces 124c, 126c, etc., of the neighboring one of the coloring layers 124, 126, etc. Therefore, as different from the conventional color imaging device described above with reference to FIG. 8 and FIG. 9, color mixing does not occur in light entering each of the plurality of coloring layers 124, 126, etc.

In this embodiment, the microlens 134 formed in association with each of the plurality of coloring layers 124, 126, etc., is formed into a hemispherical shape. However, in a case that the sensitivity center of the photoelectric transducer 12 is arranged to deviate from the center of a pixel corresponding thereto, the microlens 134 can be formed to have an asymmetrical vertical section as indicated by a two dots chain line in FIG. 5B to condense light at the sensitivity center of the photoelectric transducer 12 corresponding thereto. This can be easily achieved by making an asymmetrical distribution of black dots (or white dots) in a non-illustrated halftone mask that is used for a pattern exposure when forming each lens mother model 132 from the non-illustrated lens mother model layer formed on the flat surface of the flattening layer 130 by performing a pattern exposure and a development according to a known photolithography technology. In FIG. 5A, an asymmetrical vertical section of the lens mother model 132 formed as described above is indicated by a two dots chain line. This vertical section of the lens mother model 132 is the same as the asymmetrical vertical section of the microlens 134 which is formed from the lens mother model 132 and indicated by the two dots chain line in FIG. 5B.

Fourth Embodiment

Next, with reference to FIGS. 6A to 6C, a color imaging device manufacturing method according to a fourth embodiment will be explained. This manufacturing method forms a plurality of microlenses on the plurality of color imaging layers 124, 126, etc., of the color filter in the color imaging device to association with the plurality of coloring layers 124, 126, etc., the color imaging device being manufactured by the color imaging device manufacturing method according to the second embodiment of the present invention and described above with reference to FIGS. 3A to 4B.

Figure 6A:
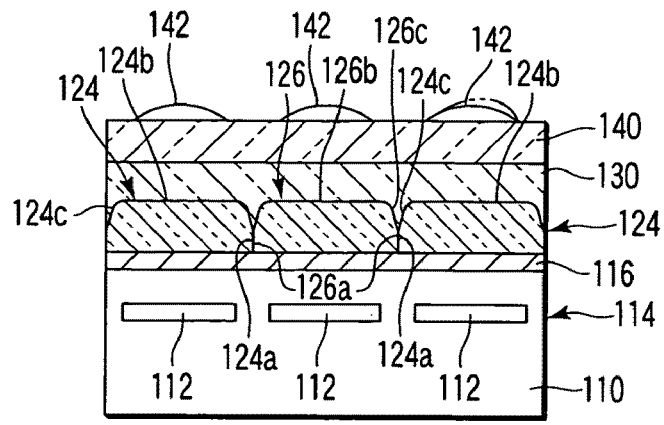
FIG. 6A is a vertical sectional view schematically showing a microlens formation preparing step in a color imaging device manufacturing method according to a fourth embodiment of the present invention, where microlenses are formed on the color filters of the color imaging device manufactured by the color imaging device manufacturing method according to the second embodiment of the present invention and explained with reference to FIGS. 3A to 4B.
Figure 6B:
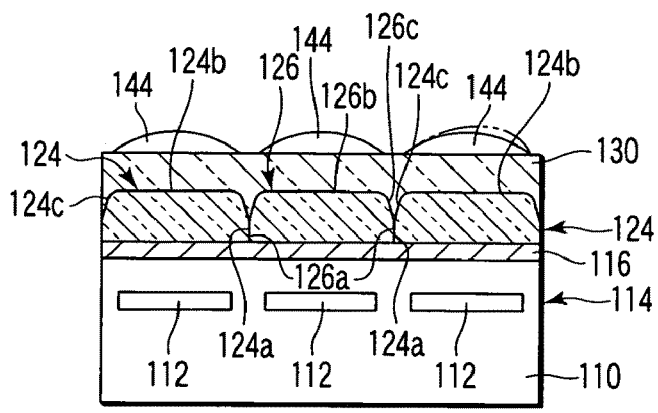
FIG. 6B is a vertical sectional view schematically showing a microlens formation intermediate step that is continuously carried out after the microlens formation preparing step shown in FIG. 6A is performed in the color imaging device manufacturing method according to the fourth embodiment of the present invention.

In this fourth embodiment, as shown in FIG. 6A, a flattening layer 130 of a transparent resin is formed on the flat end portions 124b, 126b, etc., of the plurality of coloring layers 124, 126, etc., of the color filter in the color imaging device. In this embodiment, the flattening layer 130 has a thickness of approximately 1 µm, and is formed of, for example a thermosetting acrylic transparent resin. The flattening layer 130 fills the grooves created between the inclined surfaces 124c, 126c, etc., that are continuous toward the peripheries of the flat end portions 124b, 126b, etc., from the ends of the side surfaces 124a, 126a, etc., of the plurality of coloring layers 124, 126, etc., the ends being located in the opposite side of the semiconductor substrate 110, and provides a flat surface on the plurality of coloring layers 124, 126, etc.

An etching control layer 140 is formed on the flat surface of the flattening layer 130. In this embodiment, the etching control layer 140 has a thickness of approximately 1 µm, and is formed of, for example a photosensitive phenol novolac resin.

Further, for example, a phenol resin having a thermal reflow property is coated on the etching control layer 140 by, for example a spin coating method, thereby forming a non-illustrated lens mother model layer. In this embodiment, the non-illustrated lens mother model layer has a thickness of approximately 0.4 µm.

Furthermore, this lens mother model layer is subjected to a pattern exposure in accordance with a known photolithography technology, thereby obtaining a predetermined pattern. This predetermined pattern is heated and subjected to a thermal reflow, thus forming each hemispherical lens mother model 142 on the surface of the etching control layer 140 to match with the center of each of the plurality of coloring layers 124, 126, etc.

When the etching control layer 140 is formed of a resin having a benzene ring as a bone structure or has, for example an ultraviolet absorber having a benzene ring added therein, a surface roughness caused by a dry etching can be suppressed. Moreover, the etching control layer 140 can be formed of a thermosetting resin or a photosensitive resin that can be subjected to alkali development.

Then, the etching control layer 140 is dry-etched by a known dry etching device utilizing a mixed gas of $CF_4$ and $C_4F_8$ as an etching gas with each lens mother model 142 being used as a mask. The etching control layer 140 is processed by transferring a shape of each lens mother model 142 to the etching control layer 140, thereby forming each intermediate lens 144 on the flattening layer 130 as shown in FIG. 6B.

In this embodiment, an etching rate of the etching control layer 140 is set slower than an etching rate of the lens mother model 142. Therefore, a speed of a dry etching to the etching control layer 140 can be decreased, thus suppressing a surface roughness of each intermediate lens 144 formed from the etching control layer 140 by the dry etching.

Subsequently, only $CF_4$ is supplied to the known dry etching device as the etching gas and performing a dry etching to the flattening layer 130 with each intermediate lens 144 being used as a mask. Further, the flattening layer 130 is processed by transferring a shape of each intermediate lens 144 to the flattening layer 130, thereby forming a plurality of microlenses 146 associated with the plurality of coloring layers 124, 126, etc., to improve a light collecting power to each of the plurality of photoelectric transducers 112, as shown in FIG. 6C.

In this embodiment, each microlens 146 has a height of approximately 0.5 µm. Furthermore, the dry etching to the flattening layer 130 is stopped before it reaches the inclined surfaces 124c, 126c, etc., of the plurality of coloring layers 124, 126, etc., to avoid surface roughness of the inclined surfaces 124c, 126c, etc., of the plurality of coloring layers 124, 126, etc., due to the dry etching. As a result, the plurality of coloring layers 124, 126, etc., with the inclined surfaces 124c, 126c, etc., can sufficiently demonstrate an original spectral characteristic of the color filter.

Moreover, when the flattening layer 130 is formed of a resin having a benzene ring as a bone structure or has, e.g., an ultraviolet absorber having a benzene ring added therein, the surface roughness caused by the dry etching can be suppressed. Therefore, an optical performance of each microlens 134 formed from the flattening layer 130 by the dry etching can be further improved.

In this fourth embodiment, the etching control layer 140 that suppresses the surface roughness caused by the dry etching is formed on the flattening layer 130, each lens mother model 142 is formed on the surface of the etching control layer 140, and each intermediate lens 144 is precisely transferred to the etching control layer 140 from each lens mother model 142 by the dry etching. Additionally, transferring the shape of this intermediate lens 144 to the flattening layer 130 by the dry etching enables forming each microlens 146. Therefore, the surface roughness of the microlens 146 caused by the dry etching in the fourth embodiment can be greatly reduced as compared with the third embodiment where the shape of each lens mother model 132 directly formed on the surface of the flattening layer 130 is transmitted to the flattening layer 130 by the dry etching to form each microlens 134.

That is, an optical performance of each microlens 146 formed in the fourth embodiment is much better than an optical performance of each microlens 134 formed in the third embodiment.

Figure 6C:
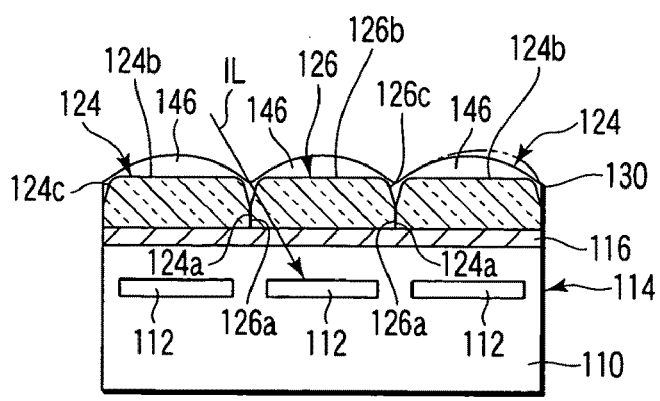
FIG. 6C is a vertical sectional view schematically showing a state where the microlenses are formed on the color filters of the color imaging device manufactured by the color imaging device manufacturing method according to the second embodiment of the present invention and explained with reference to FIGS. 3A to 4B through the microlens formation preparing step in FIG. 6A and the microlens formation intermediate step in FIG. 6B.

Further, in the color imaging device shown in FIG. 6C, manufactured by the manufacturing method according to the fourth embodiment, and having the above described configuration, a light beam IL which has obliquely entered a position of each of the plurality of coloring layers 124, 126, etc., near the neighboring coloring layers 124, 126, etc., can enter each of the plurality of coloring layers 124, 126, etc., without being transmitted through a peripheral portion of each of the flat end portions 124b, 126b, etc., of the neighboring coloring layers 124, 126, etc., owing to the inclined surfaces 124c, 126c, etc., of the adjacent coloring layers 124, 126, etc. Therefore, as different from the conventional color imaging device explained with reference to FIG. 8 or FIG. 9, color mixing does not occur in light entering each of the plurality of coloring layers 124, 126, etc.

The microlens 146 formed to associate with each of the plurality of coloring layers 124, 126, etc., is formed into a hemispherical shape. However, when the sensitivity center of the photoelectric transducer 112 is arranged to deviate from the center of the pixel corresponding thereto, the microlenses 146 can be formed to have an asymmetrical vertical section as indicated by a two dots chain line in FIG. 6C to condense light at the sensitivity center of the photoelectric transducer 112 corresponding thereto.

This can be easily achieved by making an asymmetrical distribution of black dots (or white dots) in a non-illustrated halftone mask used for a pattern exposure when forming each lens mother model 142 from the non-illustrated lens mother model layer on the etching control layer 140 by performing a pattern exposure and a development in accordance with a known photolithography technology. An asymmetrical vertical section of the lens mother model 142 is indicated by a two dots chain line in FIG. 6A. This vertical section of the lens mother model 142 is the same as the asymmetrical vertical section of the microlens 134 indicated by the two dots chain line in FIG. 6C, the microlens 134 being formed on the flattening layer 130 through the intermediate lens 144 formed on the etching control layer 140 from the lens mother model 142.

Fifth Embodiment

Next, with reference to FIGS. 7A and 7B, a color imaging device manufacturing method according to a fifth embodiment will be described. The manufacturing method forms a plurality of microlenses on the plurality of coloring layers 124, 126, etc., of the color filter in the color imaging device to associate with the plurality of coloring layers 124, 126, etc., the color imaging device being manufactured by the color imaging device manufacturing method according to the second embodiment of the present invention described above with reference to FIGS. 3A to 4B.

Figure 7A:
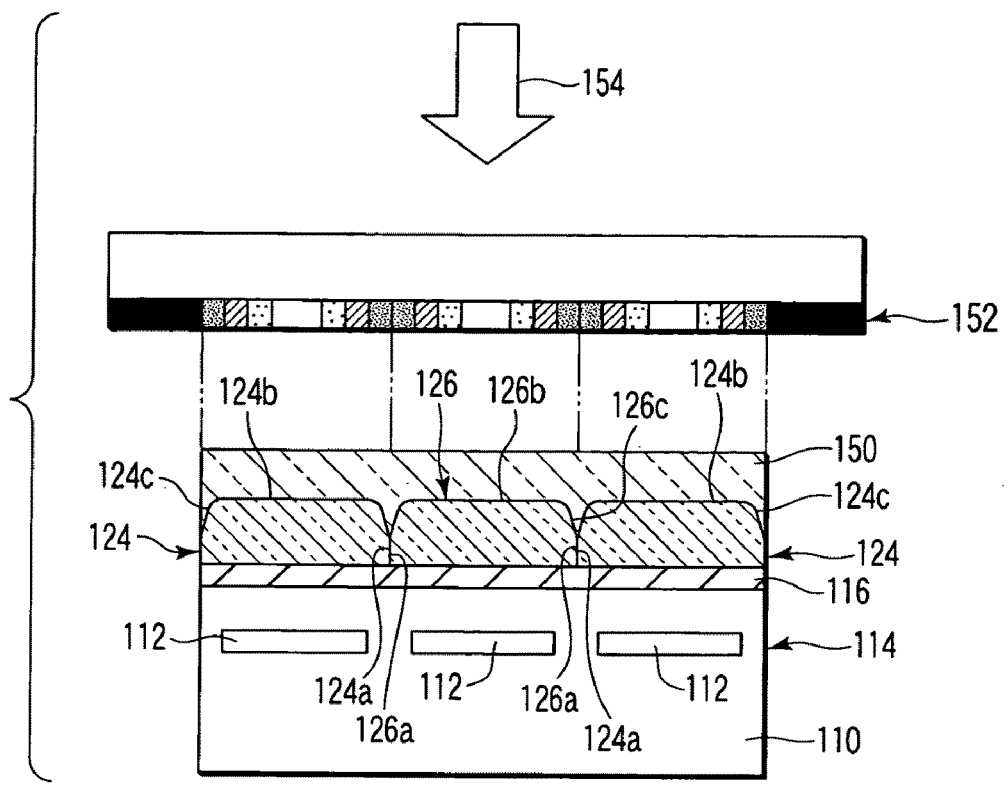
FIG. 7A is a vertical sectional view schematically showing a microlens formation preparing step in a color imaging device manufacturing method according to a fifth embodiment of the present invention, where microlenses are formed on the color filters of the color imaging device manufactured by the color imaging device manufacturing method according to the second embodiment of the present invention and explained with reference to FIGS. 3A to 4B.

In this fifth embodiment, as shown in FIG. 7A, a transparent negative-type photosensitive resist layer 150 is formed on the flat end portions 124b, 126b, etc., of the plurality of coloring layers 124, 126, etc., of the color filter in the color imaging device, and then exposure 154 of a predetermined pattern is performed by using a halftone mask 152 to associate with the flat end portions 124b, 126b, etc., of the plurality of coloring layers 124, 126, etc. With the predetermined pattern, each of a plurality of portions of the negative-type photosensitive resist layer 150 associated with the flat end portions 124b, 126b, etc., of the plurality of coloring layers 124, 126, etc., is formed into a shape of a microlens by a development processing after the exposure, the microlens being concentric with the center of each of the flat end portions 124b, 126b, etc., more specifically the center of each of the plurality of photoelectric transducers 12 with which the plurality of coloring layers 124, 126, etc.

The halftone mask 152 used in this embodiment has the same configuration as that of the halftone mask 120 used when performing pattern exposure to the negative-type color resist layer 118 of a predetermined color to form the coloring layers 24, 26, or etc., each having a predetermined dimension and shape by the development from the predetermined negative-type color resist layer 118 in the color imaging device manufacturing method according to the second embodiment of the present invention described above with reference to FIGS. 3A to 4A, and this mask is different from the halftone mask 120 only in a pattern shape based on a difference in a shape of an object that is to be formed by development.

Each microlens 156 formed from the negative-type photosensitive resist layer 150 by a pattern exposure and a development has a simpler processing step as compared with the microlens 34 processed from the flattening layer 30 of the transparent resin by using the dry etching in the color imaging device manufacturing method according to the third embodiment of the present invention described above with reference to FIGS. 5A and 5B and the microlens 46 processed from the etching control layer 40 and the flattening layer 30 of the transparent resin by using the dry etching in the color imaging device manufacturing method according to the fourth embodiment described above with reference to FIGS. 6A to 6C, and this microlens 156 has a small surface roughness like the microlens 46 formed in the fourth embodiment.

That is, like the microlens 46 formed in the fourth embodiment, an optical performance of the microlens 156 formed in the fifth embodiment is better than an optical performance of the microlens 34 formed in the third embodiment.

Figure 7B:
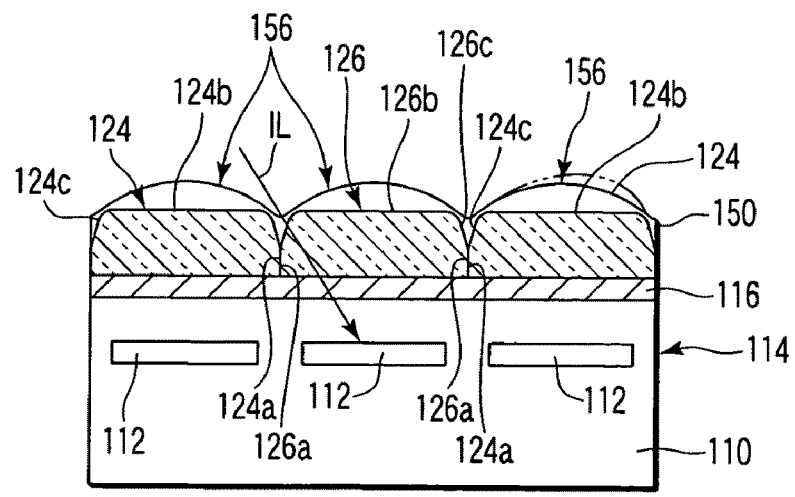
FIG. 7B is a vertical sectional view schematically showing a state where the microlenses are formed on the color filters of the color imaging device manufactured by the color imaging device manufacturing method according to the second embodiment of the present invention and explained with reference to FIGS. 3A to 4B after the microlens formation preparing step in FIG. 7A is performed in the color imaging device manufacturing method according to the fifth embodiment of the present invention.

Also, in the color imaging device shown in FIG. 7B, manufactured by the manufacturing method according to the fifth embodiment, and having the above described configuration, a light beam IL that has obliquely entered a portion of each of the plurality of coloring layers 124, 126, etc., the portion near the neighboring coloring layers 124, 126, etc., can enter each of the plurality of coloring layers 124, 126, etc., without being transmitted through a peripheral portion of each of the flat end portions 124b, 126b, etc., of the neighboring coloring layers 124, 126, etc., owing to the inclined surfaces 124c, 126c, etc., of the neighboring coloring layers 124, 126, etc. Therefore, as different from the conventional color imaging device described above with reference to FIG. 8 and FIG. 9, color mixing does not occur in light entering each of the plurality of coloring layers 124, 126, etc.

The microlens 156 formed to associate with each of the plurality of coloring layers 124, 126, etc., is formed into a hemispherical shape in this embodiment. However, when the sensitivity center of the photoelectric transducer 112 is arranged to deviate from the center of a pixel corresponding thereto, the microlens 156 can have an asymmetrical vertical section as indicated by a two dots chain line in FIG. 7B in order to condense light at the sensitivity center of the photoelectric transducer 112 corresponding thereto. This can be easily achieved by making an asymmetrical distribution of black dots (or white dots) in the non-illustrated halftone mask used when forming each microlens 156 from the negative-type photosensitive resist layer 150 by the pattern exposure and the development.

Further, in the color imaging device according to the fifth embodiment, the microlens 156 formed to associate with each of the plurality of coloring layers 124, 126, etc., is formed by using the negative-type photosensitive resist. However, the microlens 156 can be also formed by using a positive-type photosensitive resist.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A color imaging device comprising:
   a semiconductor substrate including a plurality of photoelectric transducers; and
   a color filter including a plurality of coloring layers provided to associate with the plurality of photoelectric transducers of the semiconductor substrate,
   each of the plurality of coloring layers of the color filter including a side surface that is erected with respect to a surface of the semiconductor substrate, and an inclined surface that is continuous from an end of the side surface located in the opposite side of the semiconductor substrate toward an end portion of the coloring layer located in the opposite side of the semiconductor substrate,
   the plurality of coloring layers being arranged with their side surfaces being in contact with each other without a gap therebetween, and
   the end portion of the coloring layer having a curved surface shape protruding toward the opposite side of the corresponding photoelectric transducer.

2. The color imaging device according to claim 1, wherein the plurality of coloring layers include at least one coloring layer having an asymmetrical vertical section.

3. The color imaging device according to claim 1, wherein the inclined surface of the coloring layer has a curved surface shape protruding toward the opposite side of the photoelectric transducer corresponding thereto.

4. The color imaging device according to claim 1, wherein the side surface of the coloring layer has a height ranging from 0.4 μm to 0.9 μm, and a height from the end of the side surface located in the opposite side of the semiconductor substrate to the end portion of the coloring layer located in the opposite side of the semiconductor substrate is set in a range between 1.8 μm to 0.1 μm.

5. The color imaging device according to claim 1, wherein the coloring layer is formed by exposing and developing a color resist layer.

6. The color imaging device according to claim 5, wherein the color resist layer is a positive-type color resist layer.

7. The color imaging device according to claim 1, wherein an ultraviolet absorbing layer is interposed between the semiconductor layer and the color filter.

8. A color imaging device comprising:
   a semiconductor substrate including a plurality of photoelectric transducers, and a color filter including a plurality of coloring layers provided to associate with the plurality of photoelectric transducers of the semiconductor substrate,
   each of the plurality of coloring layers of the color filters including a side surface that is erected with respect to a surface of the semiconductor substrate, and an inclined surface that is continuous from an end of the side surface located in the opposite side of the semiconductor substrate toward an end portion of the coloring layer located in the opposite side of the semiconductor substrate,
   the plurality of coloring layers being arranged with their side surfaces being in contact with each other without a gap therebetween,
   the end portion of the coloring layer including a flat surface crossing the inclined surface,
   a microlens of a transparent resin being laminated on the flat surface of the end portion of the coloring layer, and
   the microlenses laminated on the flat surfaces of the end portions of the two coloring layers adjacent to each other being connected with each other through the transparent resin filling a groove formed between the opposed inclined surfaces of the two coloring layers adjacent to each other.

9. The color imaging device according to claim 8, wherein the inclined surface of the coloring layer has a curved surface shape protruding toward the opposite side of the photoelectric transducer corresponding thereto.

10. The color imaging device according to claim 8, wherein the plurality of microlenses laminated on the flat surfaces of the end portions of the plurality of coloring layers include at least one microlens having an asymmetrical vertical section.

11. The color imaging device according to claim 8, wherein the side surface of the coloring layer has a height ranging from 0.4 μm to 0.9 μm, and a height from the end of the side surface located in the opposite side of the semiconductor substrate to the end portion of the coloring layer located in the opposite side of the semiconductor substrate is set in a range between 0.6 μm to 0.1 μm.

12. The color imaging device according to claim 8, wherein the coloring layer is formed by exposing and developing a color resist layer.

13. The color imaging device according to claim 12, wherein the color resist layer is a positive-type color resist layer.

14. The color imaging device according to claim 8, wherein an ultraviolet absorbing layer is interposed between the semiconductor substrate and the color filter.

* * * * *